United States Patent [19]
Parker et al.

[11] Patent Number: 5,495,205
[45] Date of Patent: Feb. 27, 1996

[54] DIGITAL CONTROLLED OSCILLATOR AND METHOD THEREOF

[75] Inventors: Lanny L. Parker, Mesa; Ahmad H. Atriss, Chandler; Benjamin C. Peterson, Tempe, all of Ariz.

[73] Assignee: Robert D. Atkins, Schaumburg, Ill.

[21] Appl. No.: 369,230

[22] Filed: Jan. 6, 1995

[51] Int. Cl.$^6$ ................................................ H03L 7/08
[52] U.S. Cl. ..................... 331/1 A; 331/8; 331/17; 331/25; 331/57; 327/159
[58] Field of Search ........................ 331/1 A, 2, 8, 331/16, 17, 18, 25, 36 C, 47, 49, 55, 57, 179; 327/107, 156, 159; 360/51; 455/260

[56] References Cited

U.S. PATENT DOCUMENTS 5,302,920  4/1994  Bitting ........................ 331/57 X
5,357,217  10/1994  Marchesi et al. ................. 331/57

*Primary Examiner*—David Mis
*Attorney, Agent, or Firm*—Robert D. Atkins

[57] ABSTRACT

A digital controlled oscillator (14) generates an oscillator clock that is phase locked to a reference clock. A control circuit (12) generates a reset signal from the reference clock that sets the edges of the oscillator signal in line with an edge of the reference clock. The reset signal must have correct timing and duration. A course tune detector (16, 18) monitors the oscillator clock and generates course tune control signals (CT) that adjust the reset signal pulse width and the oscillator signal frequency by adding and removing capacitors from the inverters in the control circuit and digital controlled oscillator. A phase comparator (22) compares the reference clock and the oscillator clock. A fine tune detector (20) monitors the phase comparison and generates fine tune control signals (FT) that make fine adjustments to the pulse width of the reset signal and the frequency of the oscillator signal.

19 Claims, 13 Drawing Sheets

DIGITAL CONTROLLED OSCILLATOR AND METHOD THEREOF

BACKGROUND OF THE INVENTION

The present invention relates in general to phase locked oscillators and, more particularly, to a digital controlled oscillator that is phase locked to an input reference clock signal.

A conventional phase lock loop (PLL) generally includes a phase detector for monitoring a phase difference between an input signal and an output signal of a voltage controlled oscillator (VCO). The phase detector generates an up control signal and a down control signal for a charge pump to charge and discharge a loop filter at a loop node at the input of the VCO. The loop voltage developed across the loop filter determines the output frequency of the VCO. The up and down control signals driving the charge pump set the proper loop filter voltage at the input of the VCO to maintain a predetermined phase relationship between the signals applied to the phase detector, as is well understood.

PLLs are widely used in data communications, local area networks in computer applications, microprocessors and data storage applications to control data transfers. The PLL provides a clock signal operating in phase with respect to the input reference signal that clock the various registers and logic gates used in the data transfer. PLLs are generally analog in nature and as such are subject to glitches in power supply potential that can cause the loop to lose phase lock. The switching of output buffers commonly used in digital design are known to glitch the power supply lines. The power supply glitches alter loop node voltage and drive the VCO to radically different frequencies. The PLL must search and reacquire phase lock. Another problem with conventional PLLs is the VCO's sensitivity to temperature variation. As the temperature varies, so does the VCO output frequency.

Hence, a need exists to provide an oscillator clock signal phase locked to an input reference signal that is robust to power supply and temperature variation.

DETAILED DESCRIPTION OF THE PREFERRED EMBODIMENT

Figure 1:
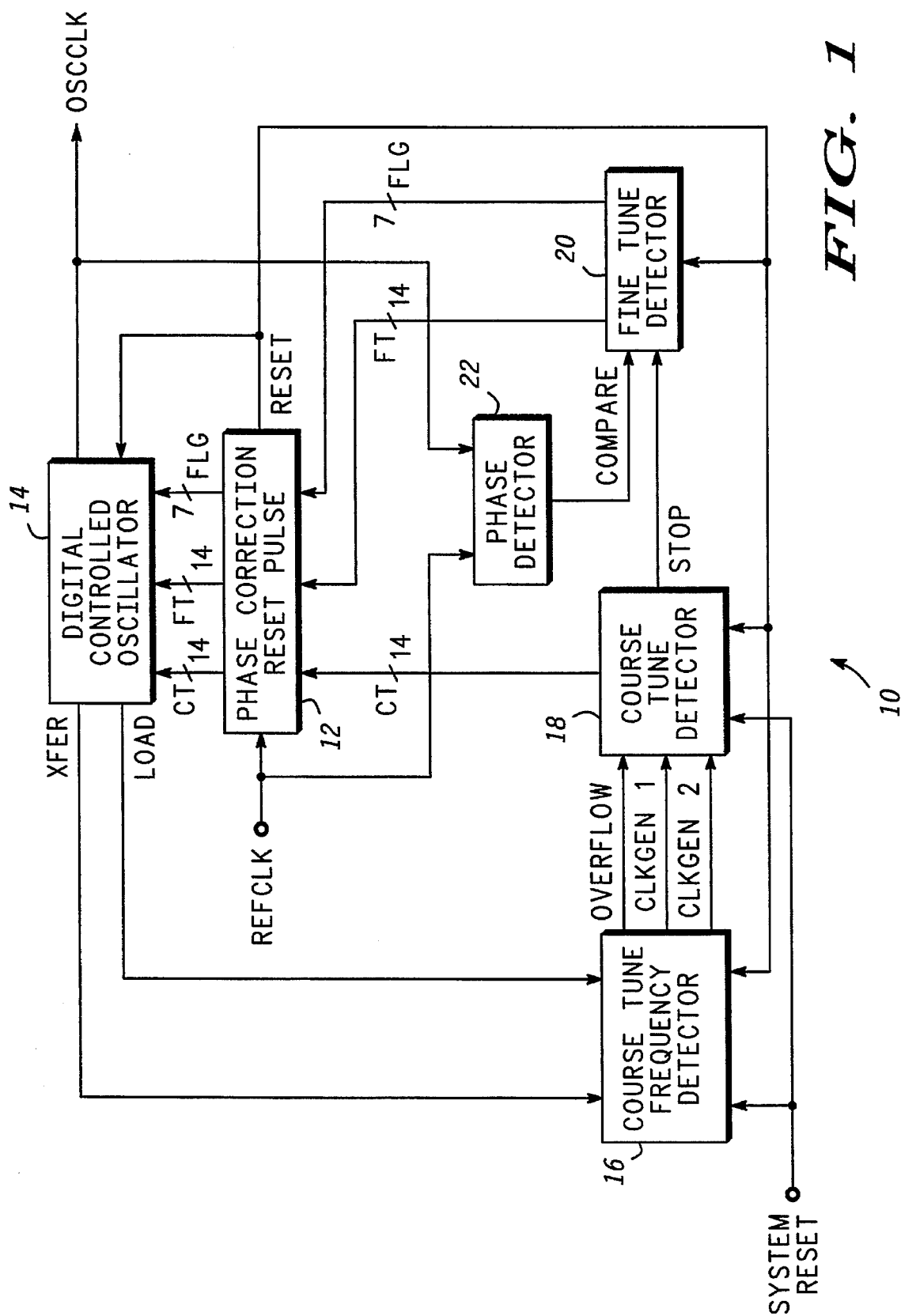
FIG. 1 is a block diagram illustrating a digital controlled oscillator.

Referring to FIG. 1, a digital controlled oscillator and control circuit 10 is shown suitable for manufacturing as an integrated circuit using conventional integrated circuit processes. The function of digital controlled oscillator and control circuit 10 is to generate an oscillator clock signal OSCCLK that is phase locked to a reference clock signal REFCLK. Temperature and process variation makes the frequency and phase of the OSCCLK uncertain. To remove the uncertainty, a RESET pulse is generated from REFCLK, for example on the falling edge, that aligns one edge of OSCCLK to an edge of REFCLK. A course tune detector and fine tune detector set the timing and duration of the RESET pulse. The OSCCLK clock thus becomes phase locked to the REFCLK clock without the use of a conventional phase lock loop. Digital controlled oscillator and control circuit 10 is robust to variation in power supply and temperature.

Phase correction reset pulse circuit 12 receives the REFCLK clock signal operating at say 5.0 MHz. Phase correction reset pulse circuit 12 also receives CT (course tune) control signals and FT (fine tune) control signals and generates the RESET pulse having particular timing and duration characteristics as described below. Digital controlled oscillator 14 is an oscillating circuit that also receives the CT and FT control signals and the RESET pulse and generates the OSCCLK clock signal operating at say 70.0 MHz. The OSCCLK clock signal is phase locked to the REFCLK clock signal. Digital controlled oscillator 14 further provides an XFER (transfer) control signal and a LOAD control signal to course tune frequency detect circuit 16. Course tune frequency detect circuit 16 also receives the RESET control signal and provides OVERFLOW, CLKGEN1 and CLKGEN2 control signals to course tune detector 18. Course tune frequency detect circuit 16 and course tune detector 18 also receive a SYSTEM RESET to initialize the system. Course tune detector 18 generates the CT control signals while fine tune detector 20 generates the FT control signals. Course tune detector 18 and fine tune detector 20 also receive the RESET pulse. Course tune detector 18 provides a STOP control signal to fine tune detector 20 when course tuning is complete. Phase detector 22 compares the phase relationship between the REFCLK and OSCCLK signals and provides a COMPARE signal to fine tune detector 20.

Figure 2:
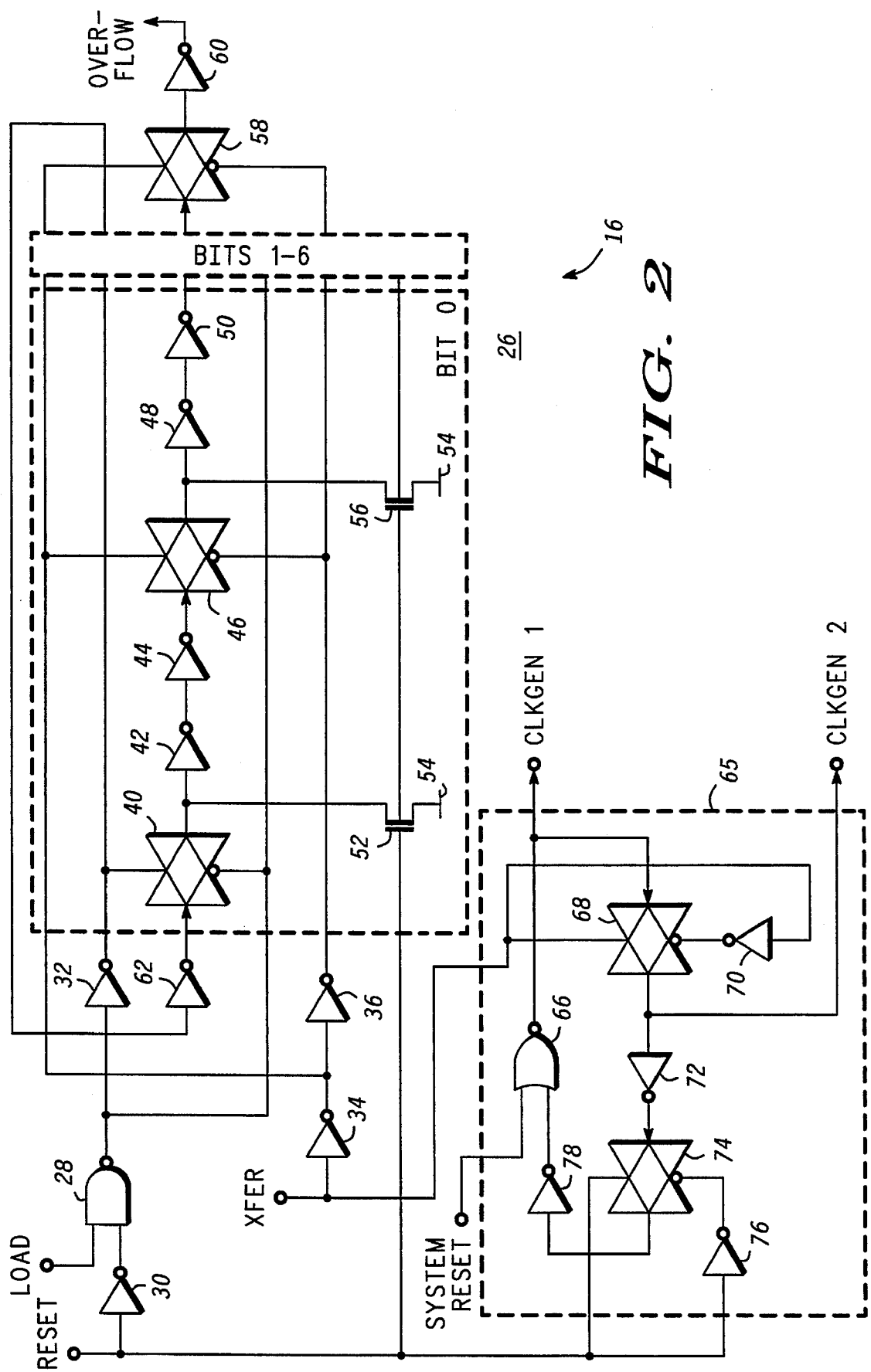
FIG. 2 is a schematic and block diagram illustrating the course tune frequency detect of FIG. 1.
Figure 3:
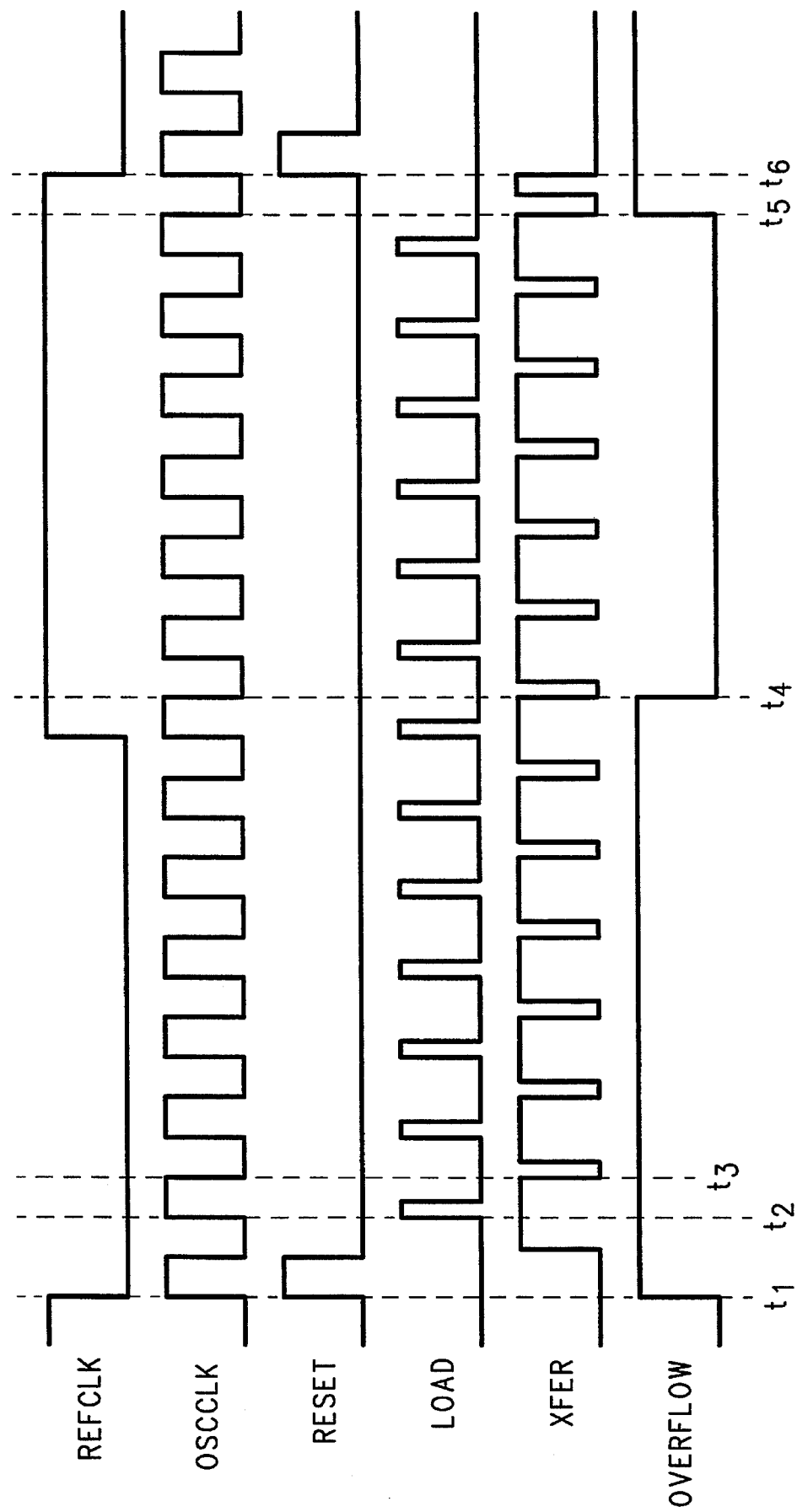
FIG. 3 is a first waveform plot useful in the explanation of the preferred embodiment.

Further detail of course tune frequency detect circuit 16 is shown in FIG. 2. Course tune frequency detect circuit 16 receives XFER and LOAD control signals and provides OVERFLOW, CLKGEN1 and CLKGEN2 control signals. The LOAD control signal is a positive pulse beginning at the rising edge of OSCCLK and having a width less than OSCCLK. The XFER control signal is a negative pulse beginning at the falling edge of OSCCLK and having a width less than OSCCLK. Thus, there is one LOAD pulse and one XFER pulse per OSCCLK period as seen in FIG. 3.

Course tune frequency detect circuit 16 includes a 7-bit shift register 26. The 5.0 MHz REFCLK has a 200 nanosecond (ns) period. The 70 MHz OSCCLK has a 14.2 ns period. Shift register 26 is selected to have 7-bits in order to count fourteen (seven up and seven down) of the 14.2 ns OSCCLK period, i.e. 200/14.2≈14. In an alternate embodiment, shift register 26 may be replaced with a 14-bit counter (not shown).

The LOAD control signal is applied to one input of NAND gate 28. The RESET control signal is inverted by inverter 30 and applied to a second input of NAND gate 28. The output of NAND gate 28 and the output of inverter 32 provide control lines to the master portions of bits 0–6 of shift register 26. The XFER control signal is inverted twice by inverters 34 and 36. The outputs of inverters 34 and 36 provide control lines to the slave portions of bits 0–6 of shift register 26.

Bit 0 of shift register 26 is shown in detail including a transmission gate 40 having inverting and non-inverting control inputs. The non-inverting control input of transmission gate 40 is coupled to the output of inverter 32. The inverting control input of transmission gate 40 is coupled to the output of NAND gate 28. All transmission gates in the present application may be implemented with an n-channel transistor and a p-channel transistor (not shown) connected back-to-back with the gate of the n-channel transistor as the non-inverting control input and the gate of the p-channel transistor as the inverting control input. The output of transmission gate 40 is coupled through series inverters 42 and 44 to an input of transmission gate 46. The non-inverting control input of transmission gate 46 is coupled to the output of inverter 34, while its inverting control input is coupled to the output of inverter 36. The output of transmission gate 46 is coupled through series inverters 48 and 50 to an input of a transmission gate 40 in bit 1 of the shift register. Bit 0 further includes transistor 52 having a drain coupled to the input of inverter 42 and a source coupled to power supply conductor 54 operating at ground potential. Transistor 56 includes a drain coupled to the input of inverter 48 and a source coupled to power supply conductor 54. The gates of transistors 52 and 56 receive the RESET control signal. Transmission gate 40, inverters 42–44 and transistor 52 comprise the master portion of bit 0. Transmission gate 46, inverters 48–50 and transistor 56 comprise the slave portion of bit 0.

Bits 1–6 of shift register 26 follow a similar construction and operation as described for bit 0. Following shift register 26, transmission gate 58 has an input coupled to the output of inverter 44 in bit 6. The output of transmission gate 58 is inverted by inverter 60 for providing the OVERFLOW control signal. The non-inverting control input of transmission gate 58 is coupled the output of inverter 34, while its inverting control input is coupled to the output of inverter 36. The output of inverter 50 in bit 6 is coupled back through inverter 62 to the input of transmission gate 40 in bit 0.

The logic one RESET signal just after time $t_1$ in FIG. 3 turns on transistors 52 and 56 in each bit section to pull down on the inputs of inverters 42 and 48 of each bit and initialize shift register 26, i.e. outputs of inverters 50, to logic zeroes "0000000". The OVERFLOW signal becomes logic one with the next XFER pulse. The output of inverter 62 is logic one. When RESET returns to logic zero, and LOAD goes to logic one at time $t_2$ in FIG. 3, the output of NAND gate 28 goes to logic zero and the output of inverter 32 goes to logic one to enable transmission gates 40. The logic one from inverter 62 loads into the master portion of bit 0 of shift register 26 and appears at the output of inverter 44. The logic zero XFER signal beginning at time $t_3$ in FIG. 3 produces a logic one at the output of inverter 34 and a logic zero at the output of inverter 36 to enable transmission gates 46. The logic one from inverter 44 loads into the slave portion of bit 0 of shift register and appears at the output of inverter 50. With each pair of LOAD and XFER signals, the logic one shifts to the right one position. Shift register 26 fills up from "0000000" to "1000000", "1100000", "1110000", "1111000", "1111100", "1111110", and "1111111". After seven LOAD and XFER pairs, shift register 26 reaches "1111111" and OVERFLOW goes to logic zero at time $t_4$ in FIG. 3 with the next XFER pulse. The output of inverter 62 goes to logic zero.

Shift register 26 now begins to decrease with each pair of LOAD and XFER signals as "0111111", "0011111", "0001111", "0000111", "0000011", "0000001", and "0000000". If the frequency of OSCCLK is sufficiently fast, enough LOAD and XFER pulses will be generated for shift register 26 to count back to "0000000" in seven more LOAD and XFER pairs before the next rising edge of the RESET pulse. The OVERFLOW signal is shown in FIG. 3 returning to logic one by the next RESET pulse. If the OVERFLOW signal is still logic zero when the next RESET pulse arrives, then that is because bit 6 still contains a logic one. The OSCCLK is running too slow and an insufficient number of LOAD and XFER pulses have been generated between RESET pulses to fill shift register 26 with logic zeroes again. The object with course tuning is to adjust the frequency of OSCCLK so that OVERFLOW goes to logic zero and returns to logic one as close as possible but before the rising edge of the RESET pulse. The OVERFLOW signal indicates whether OSCCLK is over (i.e. logic one) or under (i.e. logic zero) its target course tune frequency.

Course tune frequency detect circuit 16 further includes divide-by-two circuit 65 that provides CLKGEN1 and CLKGEN2 control signals operating at one-half the frequency of the RESET signal. A logic one SYSTEM RESET signal applied to one input of NOR gate 66 forces CLKGEN1 to logic zero at its output. A logic one XFER signal to the non-inverting control input of transmission gate 68, and a logic zero to its inverting control input by way of inverter 70, enables transmission gate 68 to pass the logic zero to CLKGEN2. Inverter 72 complements CLKGEN2 to the input of transmission gate 74. A logic one RESET signal to the non-inverting control input of transmission gate 74, and a logic zero to its inverting control input by way of inverter 76, enables transmission gate 74 to pass the logic one output state from inverter 72 to a second input of NOR gate 66 that receives a logic zero because of inverter 78. CLKGEN1 remains at logic one.

Once the SYSTEM RESET returns to logic zero, CLKGEN1 begins triggering off the rising edge of RESET, while CLKGEN2 is delayed until the following rising edge of XFER. With both inputs to NOR gate 66 at logic zero, CLKGEN1 goes to logic one, see time $t_1$ of FIG. 4. The next rising edge of XFER causes CLKGEN2 to go to logic one at time $t_2$. The next rising edge of RESET at time $t_3$ passes the logic zero from inverter 72 through transmission gate 74 and produces a logic one at the second input of NOR gate 66. The CLKGEN1 signal goes to logic zero and the CLKGEN2 goes to logic zero with the next rising edge of XFER. The next rising edge of RESET at time $t_4$ in FIG. 4 passes the logic one from inverter 72 through transmission gate 74 and produces a logic zero at the second input of NOR gate 66. The CLKGEN1 signal goes to logic one and the CLKGEN2 goes to logic one with the next rising edge of XFER. The CLKGEN1 and CLKGEN2 signals change state at the rising and falling edges of RESET, respectively, and thus operate at one-half the RESET signal frequency as shown in FIG. 4.

Figure 5:
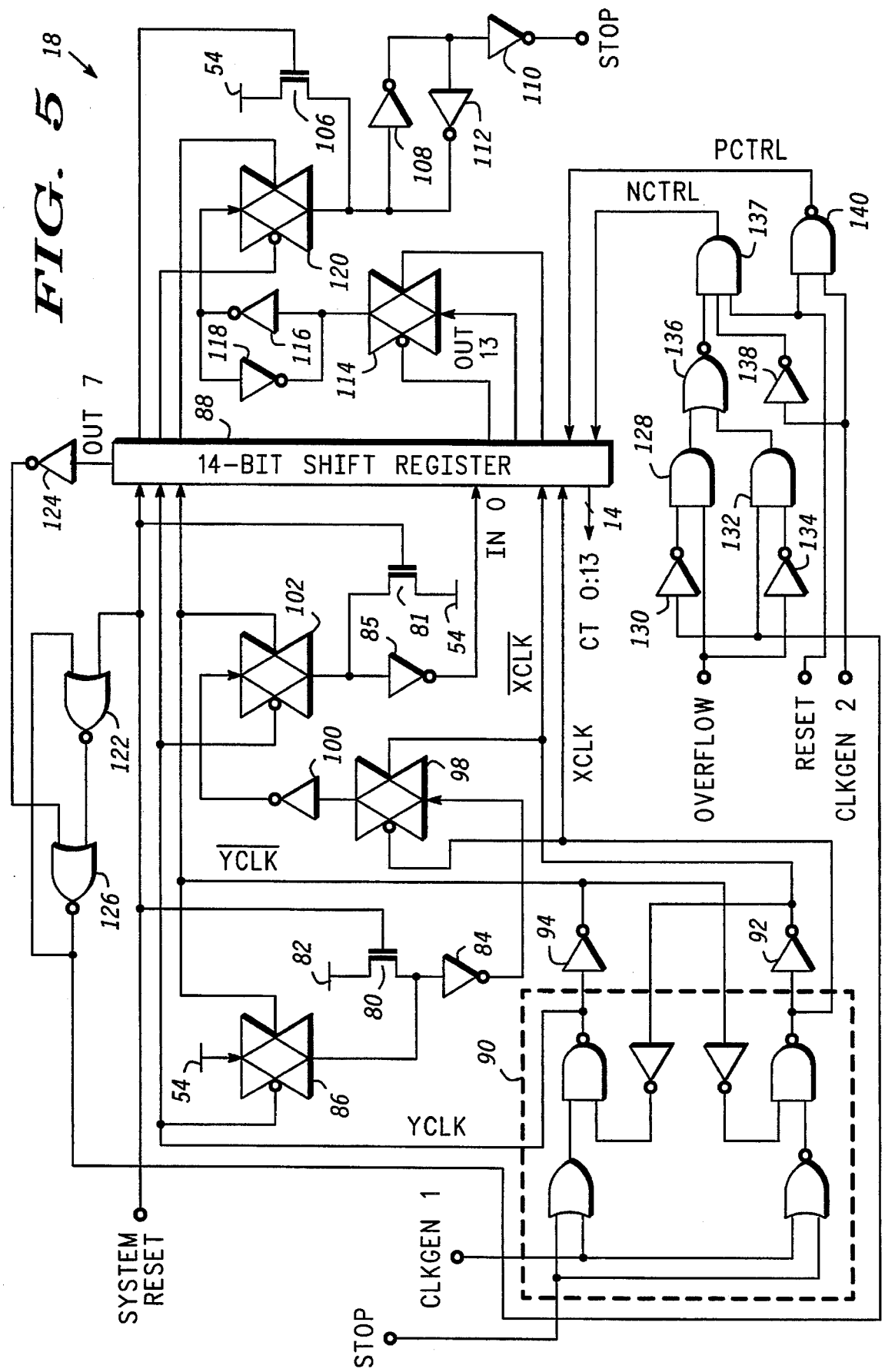
FIG. 5 is a schematic and block diagram illustrating the course tune detector of FIG. 1.

Turning to FIG. 5, course tune detector 18 includes a 14-bit control signal CT0:13 that enables and disables capacitors in phase correction reset pulse circuit 12 and digital controlled oscillator 14. The capacitors are coupled to individual outputs of an odd-number of serially coupled inverters that provide the oscillation function. By adding and subtracting capacitors one at a time to the inverter outputs with control signals CT0:13, the OSCCLK signal is course tuned to the approximate frequency of operation. Once properly set, the STOP control signal disables course tune detector 18 from further operation in the circuit.

To initialize the operation of course tune detector 18, the logic one SYSTEM RESET turns on transistors 80 and 81. Transistor 80 passes a logic one from power supply conductor 82 operating at a positive power supply potential such as $V_{DD}$=5.0 volts. The output of inverter 84 goes to logic zero. Transistor 81 passes the logic zero from power supply conductor 54 and causes the output of inverter 85 to go to logic one at the IN0 input of shift register 88. When SYSTEM RESET returns to logic zero, transmission gate 86 controls the logic state into shift register 88. Opposite phase clock generator 90 provides non-overlapping opposite phase clocks XCLK and YCLK. The operation of clock generator 90 is described in U.S. Pat. No. 5,212,412, and hereby incorporated by reference. Inverters 92 and 94 further provide complementary $\overline{XCLK}$ and $\overline{YCLK}$ clocks. When CLKGEN1 is logic one, XCLK is logic one and YCLK is logic zero. When CLKGEN1 is logic zero, XCLK is logic zero and YCLK is logic one. A logic one STOP control signal disables clock generator 90 by holding the output of the OR gate at logic one and the output of the NOR gate at logic zero.

Figure 4:
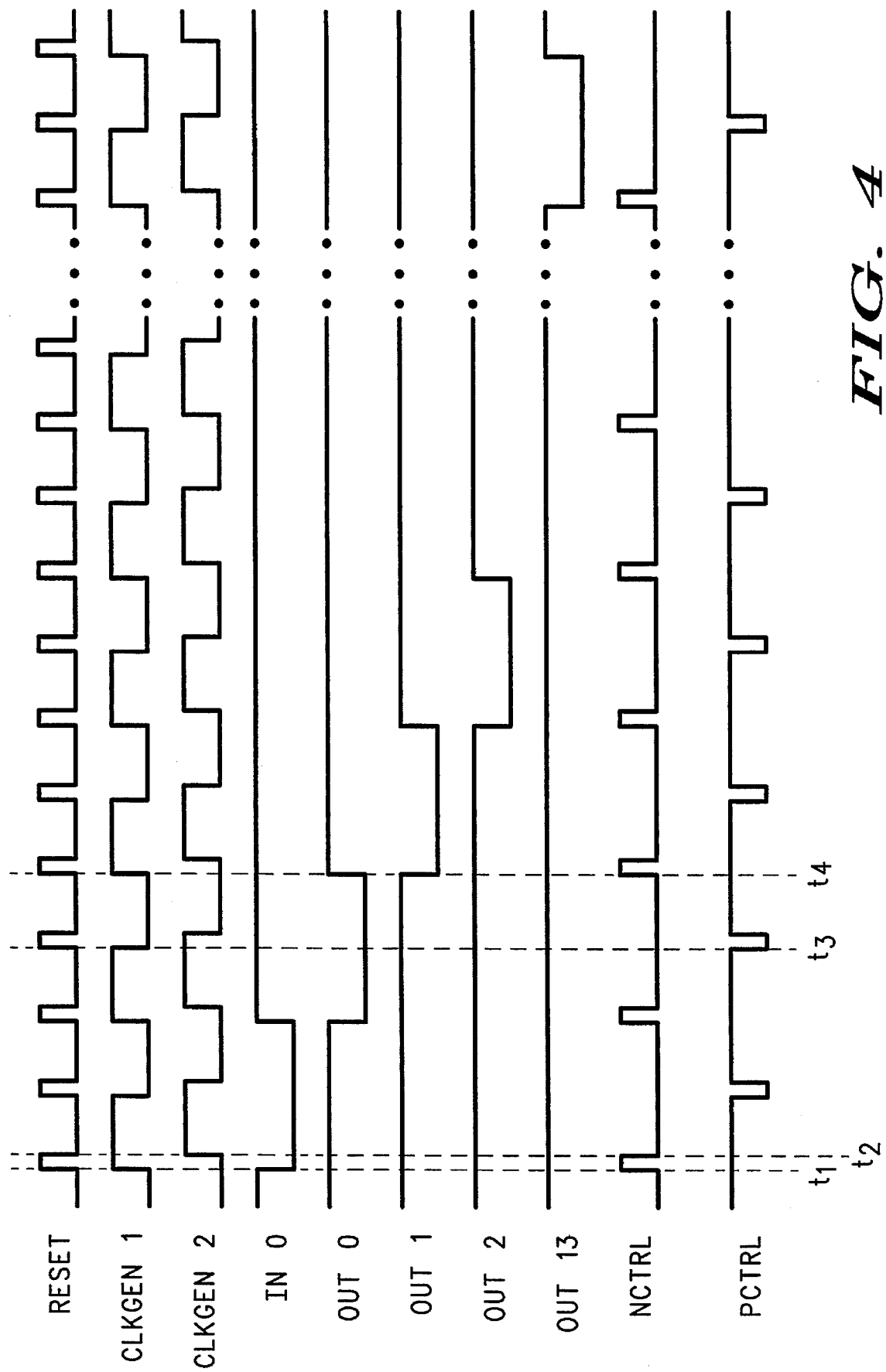
FIG. 4 is a second waveform plot useful in the explanation of the preferred embodiment.

Before time $t_1$ in FIG. 4, assume SYSTEM RESET transitions from logic one to logic zero then CLKGEN1 is logic zero and XCLK is logic zero and YCLK is logic one. Transmission gate 98 passes the initializing logic zero from inverter 84 through inverter 100 to present a logic one to the input of transmission gate 102. At time $t_1$ in FIG. 4, CLKGEN1 is logic one and XCLK is logic one and YCLK becomes logic zero to enable transmission gates 86 and 102. The logic zero from power supply conductor 54 passes through transmission gate 86 where it is inverted by inverter 84 to present a logic one to the input of transmission gate 98. The logic one from inverter 100 passes through transmission gate 102 where it is inverted by inverter 85 to present a logic zero to the IN0 input of shift register 88. At time $t_3$ in FIG. 4, CLKGEN1 returns to logic zero. XCLK is logic zero and YCLK goes to logic one to enable transmission gate 98. The logic one from inverter 84 passes through transmission gate 98 where it is inverted by inverter 100 to present a logic zero to the input of transmission gate 102. At the next rising edge of CLKGEN1, XCLK goes to logic one and YCLK becomes logic zero to enable transmission gates 86 and 102. The logic zero from power supply conductor 54 passes through transmission gate 86 where it is inverted by inverter 84 to present a logic one to the input of transmission gate 98. The logic zero from inverter 100 passes through transmission gate 102 where it is inverted by inverter 85 to present another logic one to the IN0 input of shift register 88. The logic one remains at the IN0 input for further CLKGEN1 cycles until SYSTEM RESET re-initializes the set-up. The IN0 input thus receives a "10111 . . ." sequence. The logic zero shifts through shift register 88 with the XCLK and YCLK clocks. OUT0 goes to logic zero for one XCLK and YCLK cycle, OUT1 goes to logic zero for the second XCLK and YCLK cycle, OUT2 goes to logic zero for the third XCLK and YCLK cycle, and so on as shown in FIG. 4, until OUT13 goes to logic zero for the fifteenth XCLK and YCLK cycle after SYSTEM RESET deactivated by going to logic zero.

The 14-bit shift register has fourteen outputs OUT0–OUT13, one for each bit location. OUT0–OUT13 are initialized to logic ones upon receiving the SYSTEM RESET signal, see discussion on FIG. 6. The SYSTEM RESET also turns on transistor 106 and impresses a logic zero from power supply conductor 54 through inverters 108 and 110 as the STOP control signal. Inverter 112 latches the output state of inverter 108. The output of inverter 110 provides STOP to clock generator 90. OUT13 remains logic one until the logic zero applied at IN0 ripples through the fourteen bit locations of shift register 88 in response to fourteen XCLK and YCLK clocks. The first logic zero XCLK after the SYSTEM RESET signal returns to logic zero enables transmission gate 114 to pass the logic one from OUT13. Inverter 116 complements the output state of transmission gate 114. Inverter 118 latches the output state of inverter 116. The next logic zero YCLK enables transmission gate 120 to pass the logic zero from inverter 116. STOP goes to logic zero and inverter 112 latches it in place. STOP remains logic zero until the logic zero applied at IN0 shifts to OUT13 after fourteen XCLK and YCLK clocks. One CLKGEN1 cycle later, XCLK and YCLK clock the logic zero OUT13 through transmission gates 114 and 120 whereby STOP goes to logic one to disable the course tuning.

A logic one SYSTEM RESET also initially sets NOR gate 122 to logic zero. The OUT7 signal from the output of bit 7 is logic one for the first seven shifts of shift register 88. Inverter 124 presents a logic zero to NOR gate 126 which in combination with the logic zero from NOR gate 122 causes the output of NOR gate 126 to go to logic one. When SYSTEM RESET returns to logic zero, the output of NOR gate 122 remains logic zero because of the logic one from NOR gate 126. When the OUT7 signal goes to logic zero for the seventh shift of shift register 88, inverter 124 presents a logic one to NOR gate 126 causing its output to go to logic zero. The logic zeroes to NOR gate 122 make its output logic one to latch the logic zero output of NOR gate 126. The output of NOR gate 126 remains logic zero even after OUT7 returns to logic one. Thus, the output of NOR gate 126 is logic one for the first seven shifts and logic zero for the second seven shifts of shift register 88.

The OVERFLOW signal begins at logic one at time $t_1$ in FIG. 3. The output of AND gate 128 goes to logic zero with the logic zero from inverter 130. AND gate 132 receives a logic zero from inverter 134 causing its output to go to logic zero. The output of NOR gate 136 is logic one. At time $t_1$ in FIG. 4, AND gate 137 receives a logic one RESET and a logic one from inverter 138, since CLKGEN2 is still logic zero at that time, causing NCTRL to go to logic one. When RESET returns to logic zero, NCTRL goes to logic zero. As will be shown, a logic one NCTRL connects (or disconnects) a capacitor to one inverter of the digital controlled oscillator to alter its frequency of operation. PCTRL is logic one with NAND gate 140 receiving a logic one RESET and logic zero CLKGEN2 at time $t_1$ of FIG. 4. About time $t_2$ of FIG. 4, RESET goes to logic zero and CLKGEN2 goes to logic one. PCTRL remains at logic one until time $t_3$ when RESET and CLKGEN2 are both logic one. PCTRL goes to logic zero for the duration of the RESET pulse. As will be shown, a logic zero PCTRL disconnects (or connects) a capacitor from one inverter of the digital controlled oscillator to alter its frequency of operation.

For the first seven CLKGEN1 and CLKGEN2 cycles which occur over fourteen RESET pulses, course tune detector 18 removes a capacitor from one inverter in phase correction reset pulse circuit 12 and digital controlled oscillator 14 with the logic zero PCTRL. Whatever occurs to phase correction reset pulse circuit 12 also occurs to digital controlled oscillator 14. PCTRL goes to logic zero every other RESET pulse when CLKGEN2 is logic one. Removing the capacitor temporarily speeds up the oscillator for one RESET cycle. During the next RESET cycle, course tune detector 18 monitors OVERFLOW to see whether it returns to logic one by the time of the next RESET pulse which occurs at time $t_6$ in FIG. 3. If OSCCLK is running too slow, OVERFLOW is still logic zero at the next RESET pulse. A logic zero OVERFLOW during the logic one RESET pulse leaves NCTRL as logic zero. The capacitor that was temporarily removed is left permanently disconnected since the oscillator is still running too slow. If OSCCLK is running too fast, OVERFLOW is logic one at the next RESET pulse. A logic one OVERFLOW during the logic one RESET pulse indicates that the oscillator is running even faster and the capacitor that was temporarily disconnected should be re-connected to slow it back down. NCTRL goes to logic one during RESET pulses opposite to ones that activate PCTRL, but only if OVERFLOW is logic one at the same time.

An example of monitoring the OSCCLK frequency and generating CT0:13 control signals to add and remove capacitors proceeds as follows. At the beginning of the calibration sequence, it is unknown whether OSCCLK is running too fast or too slow. If the oscillator is running too fast, the first seven CLKGEN1 and CLKGEN2 cycles are uneventful as course tune detector 18 removes capacitors from the oscillator inverter outputs and then re-connects them upon detecting the oscillator running even faster. For example, at time $t_3$ in FIG. 4 PCTRL goes to logic zero and disconnects a capacitor from one inverter of digital controlled oscillator 14 to increase its frequency of operation. Assume that OVERFLOW returns to logic one at time $t_5$ in FIG. 3. During the RESET pulse at time $t_6$ in FIG. 3, the OVERFLOW signal is logic one indicating that the oscillator is still running too fast. That is, the frequency of OSCCLK is sufficiently fast that enough LOAD and XFER pulses have been generated for shift register 26 to increment from "0000000" to "1111111" and back to "0000000" before the next rising edge of the RESET pulse, see prior discussion of FIG. 2. The logic zero from inverter 134 combines with the logic one from NOR gate 126 to drive the output of AND gate 132 to logic zero and the output of NOR gate 136 to logic one. NAND gate 137 receives all logic ones during the RESET pulse so that NCTRL is logic one at time $t_4$ in FIG. 4 to re-connect the previously removed capacitor. The NCTRL waveform plot in FIG. 4 illustrates OSCCLK from digital controlled oscillator 14 running too fast with logic one pulses at every other RESET pulse to re-connect the previously disconnected capacitor.

On the other hand, if the oscillator is running too slow, the first seven CLKGEN1 and CLKGEN2 cycles provide course tune detector 18 an opportunity to speed it up by removing capacitors from the oscillator inverter outputs and then not re-connecting them. For example, at time $t_3$ in FIG. 4 PCTRL goes to logic zero and temporarily disconnects a capacitor from one inverter of digital controlled oscillator 14 to increase its operating frequency. If the oscillator is running too slow, OVERFLOW remains logic zero because the frequency of OSCCLK is not fast to generate enough LOAD and XFER signals for shift register 26 to increment from "0000000" to "1111111" and back to "0000000" before the next rising edge of the RESET pulse. A logic zero OVERFLOW at time $t_4$ in FIG. 4 makes the output of inverter 134 logic one which combines with the logic one from NOR gate 126 to drive the output of AND gate 132 to logic one and the output of NOR gate 136 to logic zero. NAND gate 137 receives a logic zero during the RESET pulse so that NCTRL remains logic zero at time $t_4$ in FIG. 4. The capacitor that was disconnected remains that way to permanently speed up the oscillator.

For the second seven CLKGEN1 and CLKGEN2 cycles which occur over fourteen more RESET pulses, the output of NOR gate 126 is logic zero as described above. OUT7 in FIG. 5 has gone to logic zero. Course tune detector 18 adds a capacitor to one inverter in phase correction reset pulse circuit 12 and digital controlled oscillator 14 with the logic zero PCTRL. Again, whatever occurs to phase correction reset pulse circuit 14 also occurs to digital controlled oscillator 14. PCTRL goes to logic zero every other RESET pulse when CLKGEN2 is logic one. Adding the capacitor temporarily slows down the oscillator for one RESET cycle. During the next RESET cycle, course tune detector 18 monitors OVERFLOW to see whether it returns to logic one by the time of the next RESET pulse occurs. If OSCCLK is running too slow, OVERFLOW is still logic zero at the next RESET pulse. A logic zero OVERFLOW during the logic one RESET pulse makes NCTRL go to logic one. The capacitor that was temporarily added is disconnected since the oscillator is running even slower. If OSCCLK is running too fast, OVERFLOW is logic one at the next RESET pulse and NCTRL remains at logic zero. A logic one OVERFLOW during the logic one RESET pulse indicates that the oscillator is still running too fast and the capacitor that was temporarily connected should be left permanently connected to slow it down. NCTRL goes to logic one during RESET pulses opposite to ones that activate PCTRL, but only if OVERFLOW is logic zero at the same time.

Continuing with the example of monitoring the OSCCLK frequency and generating CT0:13 control signals to add and remove capacitors, if the oscillator is running too slow, the second seven CLKGEN1 and CLKGEN2 cycles are uneventful as course tune detector 18 adds capacitors to the oscillator inverter outputs. Course tune detector 18 disconnects the capacitors if it detects the oscillator running even slower. For example, PCTRL goes to logic zero and connects a capacitor to one inverter of digital controlled oscillator 14 to decrease its frequency of operation. Assume that during the RESET pulse at time $t_6$ in FIG. 3, the OVERFLOW signal is logic zero indicating that the oscillator is running too slow. That is, the frequency of OSCCLK is sufficiently slow that not enough LOAD and XFER pulses have been generated for shift register 26 to increment from "0000000" to "1111111" and back to "0000000" before the next rising edge of the RESET pulse. The logic zero OVERFLOW drives the output of NOR gate 136 to logic one. NAND gate 137 receives all logic ones during the RESET pulse so that NCTRL is logic one to disconnect the previously connected capacitor. As long as OVERFLOW is logic zero at the RESET pulse, OSCCLK from digital controlled oscillator 14 is running too slow and NCTRL goes to logic one at every other RESET pulse to disconnect the previously connected capacitor.

On the other hand, if the oscillator is running too fast, the second seven CLKGEN1 and CLKGEN2 cycles provide course tune detector 18 an opportunity to slow it down by adding capacitors to the oscillator inverter outputs and then not disconnecting them. For example, PCTRL goes to logic zero and temporarily connects a capacitor to one inverter of digital controlled oscillator 14 to decrease its frequency of operation. If the oscillator is running too fast, OVERFLOW goes to logic one by the next RESET pulse because the frequency of OSCCLK is sufficiently fast to generate enough LOAD and XFER signals for shift register 26 to increment from "0000000" to "1111111" and back to "0000000" before the next rising edge of the RESET pulse. A logic one OVERFLOW combines with the logic one from inverter 130 to drive the output of AND gate 128 to logic one and the output of NOR gate 136 to logic zero. NAND gate 137 receives a logic zero during the RESET pulse so that NCTRL remains logic zero at time $t_4$ in FIG. 4. The capacitor that was connected remains that way to permanently slow down the oscillator.

Figure 6:
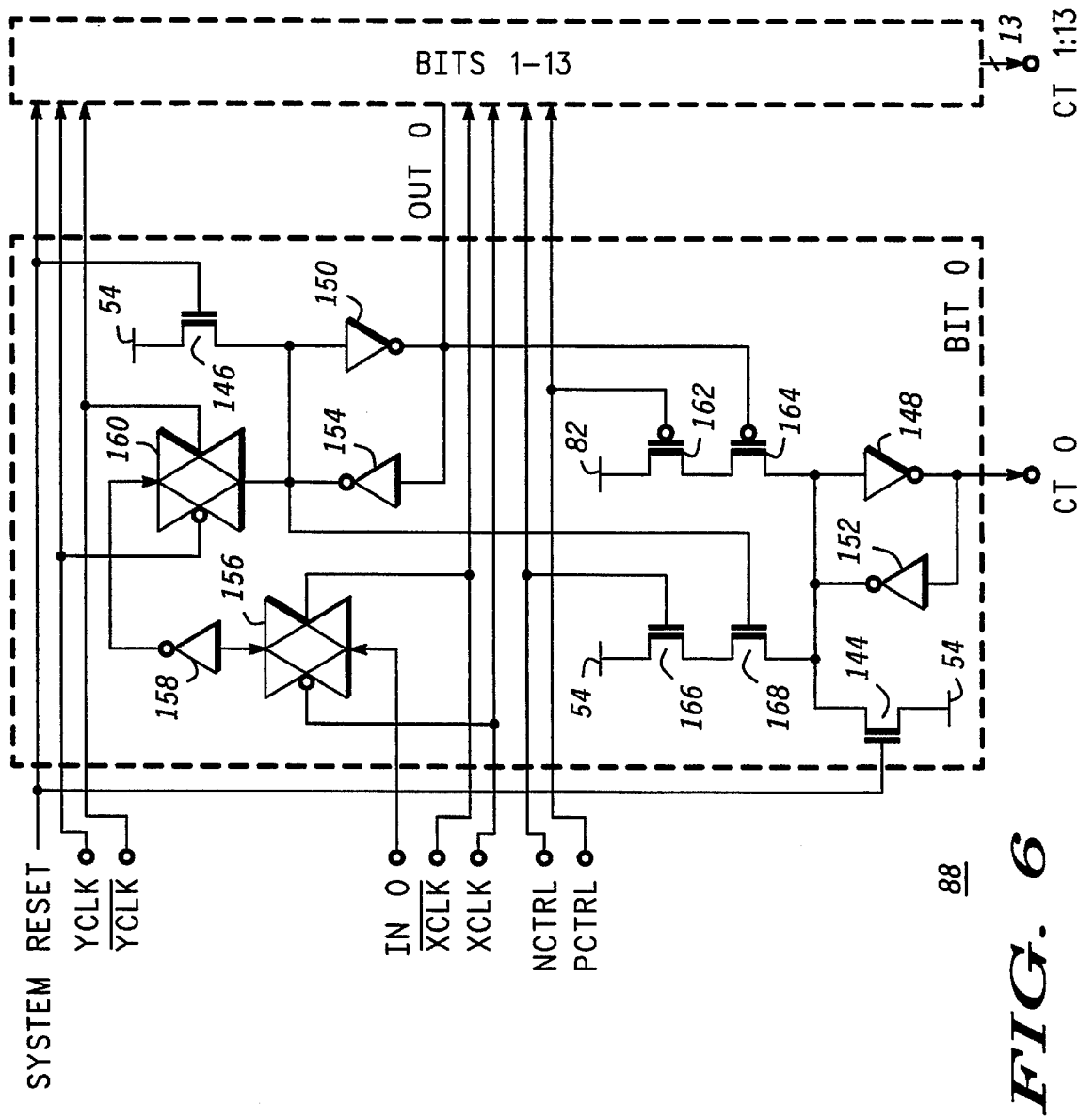
FIG. 6 is a schematic and block diagram illustrating the shift register of FIG. 5.

The above description addresses course tune adjustments where course tune frequency detect circuit 16 and course tune detector 18 are working to get phase correction reset pulse circuit 12 to have approximately the proper pulse width for RESET and digital controlled oscillator 14 to operate at approximately the proper frequency for OSCCLK, albeit a little higher than the ultimate goal. Turning to FIG. 6, further detail bit 0 of shift register 8B is shown to explain how the CT0:13 control signals are generated to sequentially add and subtract capacitors. A logic one SYSTEM RESET turns on transistors 144 and 146 and passes a logic zero from power supply conductor 54 to inverters 148 and 150 and drives CT0 and OUT0 to logic one. Inverter 152 latches the output state of inverter 148, while inverter 154 latches the output state of inverter 150.

Once SYSTEM RESET is removed, the logic zero signal applied to IN0 between times $t_1$ and $t_4$ in FIG. 4 passes through transmission gate 156 with a logic zero XCLK where it is inverted by inverter 158. The following logic zero YCLK passes the logic one from inverter 158 through transmission gate 160 where it is inverted by inverter 150 so that OUT0 goes to logic zero for bit 0 of shift register 88. The logic zero PCTRL control signal at time $t_3$ in FIG. 4 when OUT0 is logic zero turns on transistors 162 and 164 to pass the logic one from power supply conductor 82 to inverter 148 that complements the signal and presents CT0 as logic zero to temporarily remove a capacitor. Inverter 152 latches the logic zero CT0 signal in place. If NCTRL goes to logic one at the next RESET pulse as described above, transistors 166 and 168 pass the logic zero from power supply conductor 54 to inverter 148 that complements the signal and presents CT0 as logic one to re-connect the capacitor. Transistor 168 conducts with the logic one at the output of inverter 154. Inverter 152 again latches the logic one CT0 signal in place.

Bits 1–13 of shift register 88 follow a similar construction and operation as described for bit 0. The logic zero propagating through the shift register remains in each bit for two periods of RESET. Bits without the logic zero have transistors 164 and 168 turned off. Only the bit with the logic zero responds to the PCTRL and NCTRL control signals. During a first RESET cycle for each bit, the corresponding CTi (where i=0–13) control line goes to logic zero to temporarily remove (or add) a capacitor. A second RESET cycle for each bit puts it back or leaves it off depending on the effect on the OSCCLK frequency. That is, CTi may remain logic zero to make the change permanent, or CTi may return to logic one to negate the previous operation.

Figure 7:
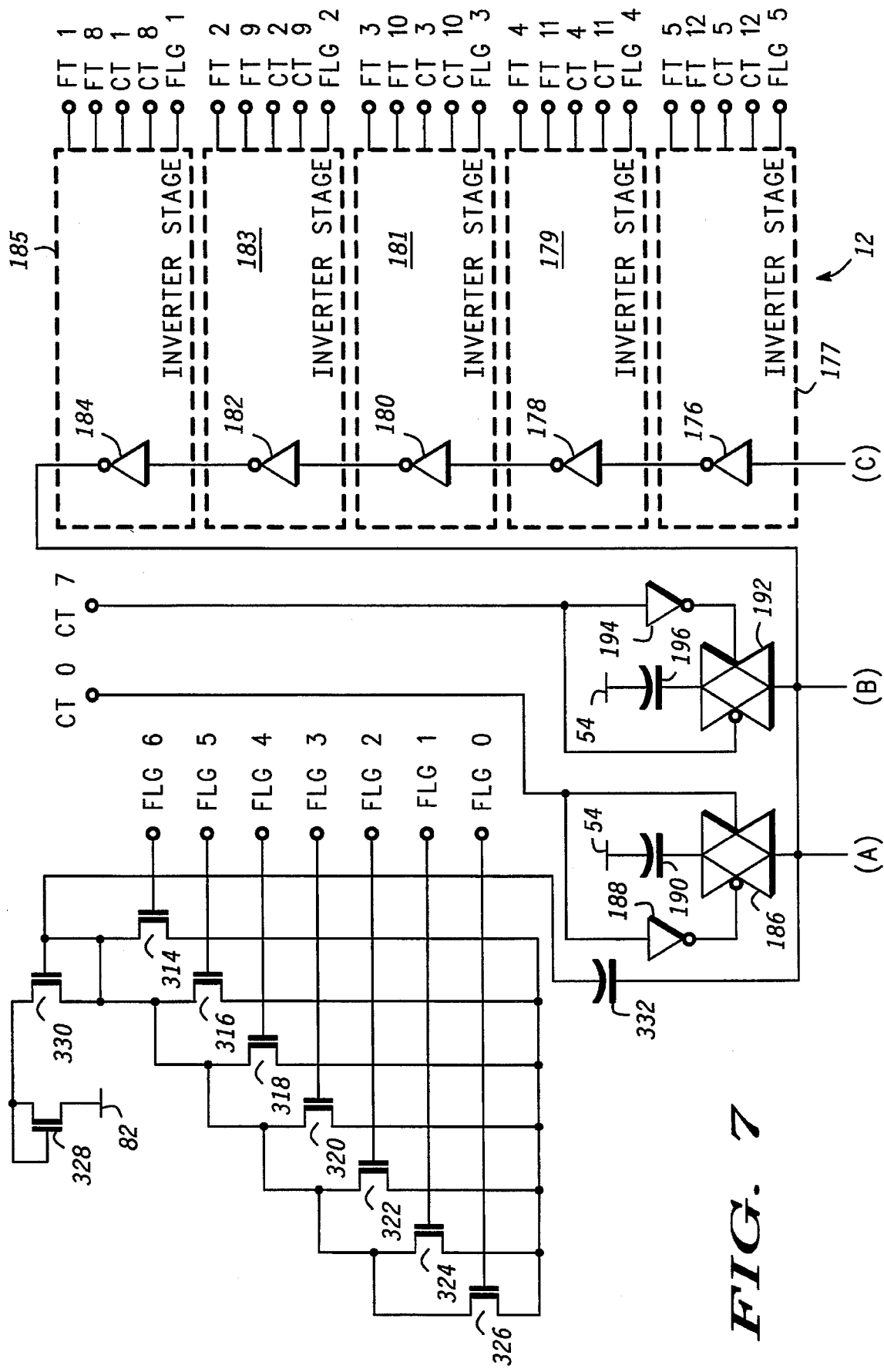
FIGS. 7–8 is a schematic and block diagram illustrating the phase correction reset pulse circuit of FIG. 1.
Figure 8:
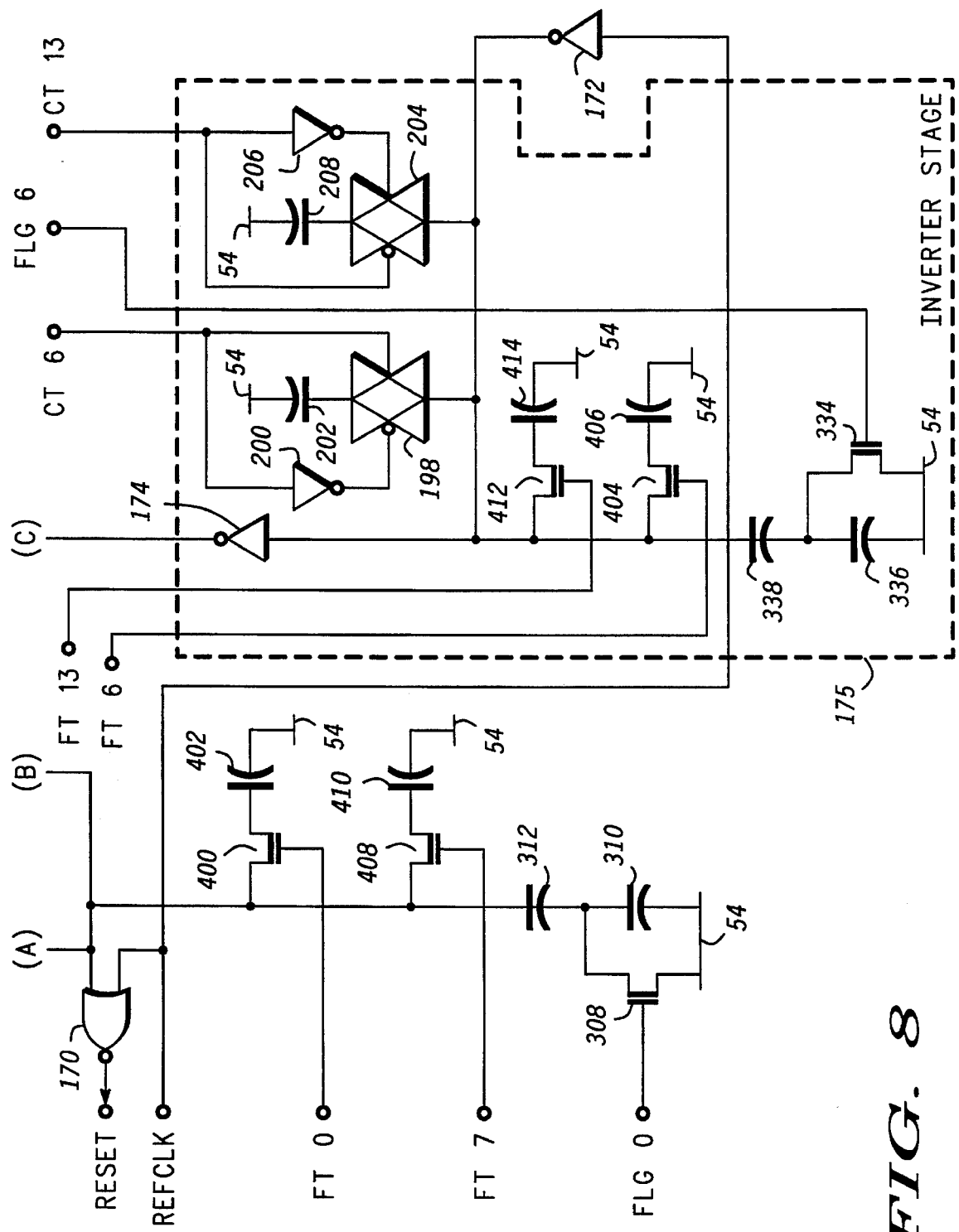

The CT0:13 control signals control application of capacitors to the inverter stages of phase correction reset pulse circuit 12 and digital controlled oscillator 14. The phase correction reset pulse circuit 12 is shown in FIGS. 7 and 8 with the reference clock REFCLK applied to one input of NOR gate 170 and through inverters 172, 174, 176, 178, 180, 182, and 184 to a second input of NOR gate 170. Just before time $t_1$ in FIG. 3, REFCLK is logic one and the output of inverter 184 is logic zero. RESET is logic zero until time $t_1$ when REFCLK goes to logic zero and combines with the logic zero from inverter 184 to drive the output of NOR gate 170 to logic one. When the logic zero REFCLK propagates through inverters 172–184, the output of inverter 184 goes to logic one and RESET returns to logic zero until the next falling edge of REFCLK at time $t_6$ in FIG. 3. The width of RESET is determined by the propagation delay through inverters 172–184 which is controlled by the capacitors adding and removing delay to the inverter transitions.

To initially remove a capacitor from the output of inverter 184, control signal CT0 is applied to the non-inverting control input of transmission gate 186 and through inverter 188 to its inverting control input. A logic zero CT0 disables transmission gate 186 and removes capacitor 190 from the output of inverter 184 to speed up transitions of the inverter string and decrease the pulse width of RESET. If CT0 returns to logic one because the frequency of OSCCLK is too fast, transmission gate 186 re-connects capacitor 190 to the output of inverter 184 to increase the pulse width of RESET. Capacitor 190 is selected at 0.25 picofarads (pf). To initially add a capacitor, control signal CT7 is applied to the inverting control input of transmission gate 192 and through inverter 194 to its non-inverting control input. A logic zero CT7 enables transmission gate 192 and connects capacitor 196 to the output of inverter 184 to slow down transitions of the inverter string and increase the pulse width of RESET. If CT7 returns to logic one because the frequency of OSCCLK is too slow, transmission gate 192 disconnects capacitor 196 from the output of inverter 184 to decrease the pulse width of RESET. Capacitor 196 is selected at 0.12 pf.

To initially remove a capacitor from the output of inverter 172, control signal CT6 is applied to the non-inverting control input of transmission gate 198 and through inverter 200 to its inverting control input. A logic zero CT6 disables transmission gate 198 and removes capacitor 202 from the output of inverter 172 to speed up transitions of the inverter string and decrease the pulse width of RESET. If CT6 returns to logic one because the frequency of OSCCLK is too fast, transmission gate 198 re-connects capacitor 202 to the output of inverter 172 to increase the pulse width of RESET. Capacitor 202 is selected at 0.14 pf. To initially add a capacitor, control signal CT13 is applied to the inverting control input of transmission gate 204 and through inverter 206 to its non-inverting control input. A logic zero CT13 enables transmission gate 204 and connects capacitor 208 to the output of inverter 172 to slow down transitions of the inverter string and increase the pulse width of RESET. If CT13 returns to logic one because the frequency of OSCCLK is too slow, transmission gate 204 disconnects capacitor 208 from the output of inverter 172 to decrease the pulse width of RESET. Capacitor 208 is selected at 0.04 pf.

Inverter stage 175 with inverter 174 is shown in detail operating in response to CT6 and CT13 for course tuning. The other inverter stages follow a similar construction and operation. For example, control signal CT1 is applied to a transmission gate 198 in inverter stage 185, while control signal CT8 is applied to a transmission gate 204. Capacitor 202 in inverter stage 185 is selected at 0.24 pf while capacitor 208 is selected at 0.10 pf. Control signal CT2 is applied to a transmission gate 198 in inverter stage 183, while control signal CT9 is applied to a transmission gate 204. Capacitor 202 in inverter stage 183 is selected at 0.22 pf while capacitor 208 is selected at 0.08 pf. Control signal CT3 is applied to a transmission gate 198 in inverter stage 181, while control signal CT10 is applied to a transmission gate 204. Capacitor 202 in inverter stage 181 is selected at 0.20 pf while capacitor 208 is selected at 0.07 pf. Control signal CT4 is applied to a transmission gate 198 in inverter stage 179, while control signal CT11 is applied to a transmission gate 204. Capacitor 202 in inverter stage 179 is selected at 0.18 pf while capacitor 208 is selected at 0.06 pf. Control signal CT5 is applied to a transmission gate 198 in inverter stage 177, while control signal CT12 is applied to a transmission gate 204. Capacitor 202 in inverter stage 177 is selected at 0.16 pf while capacitor 208 is selected at 0.05 pf.

Figure 9:
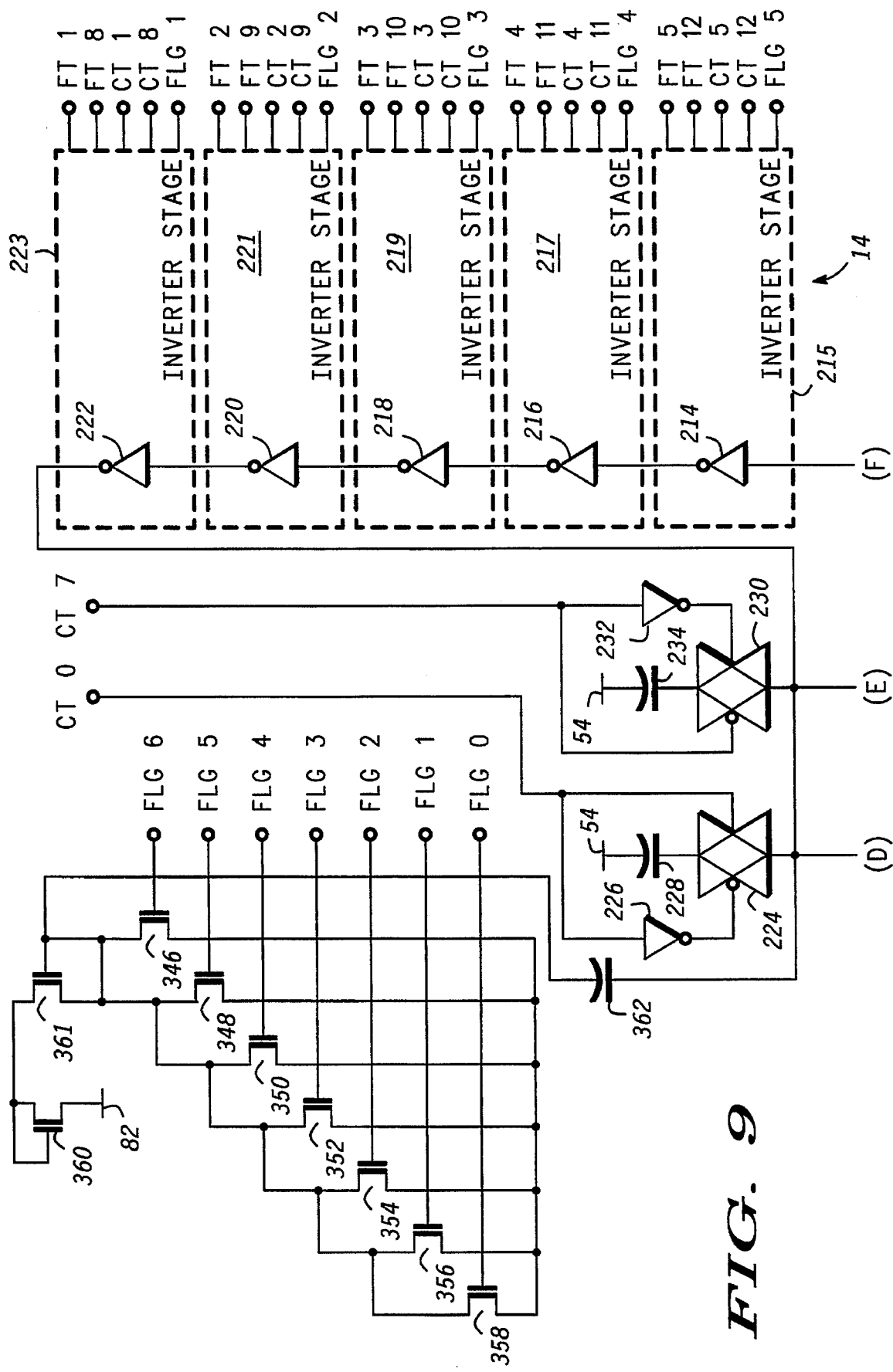
FIGS. 9–10 is a schematic and block diagram illustrating the digital controlled oscillator of FIG. 1.
Figure 10:
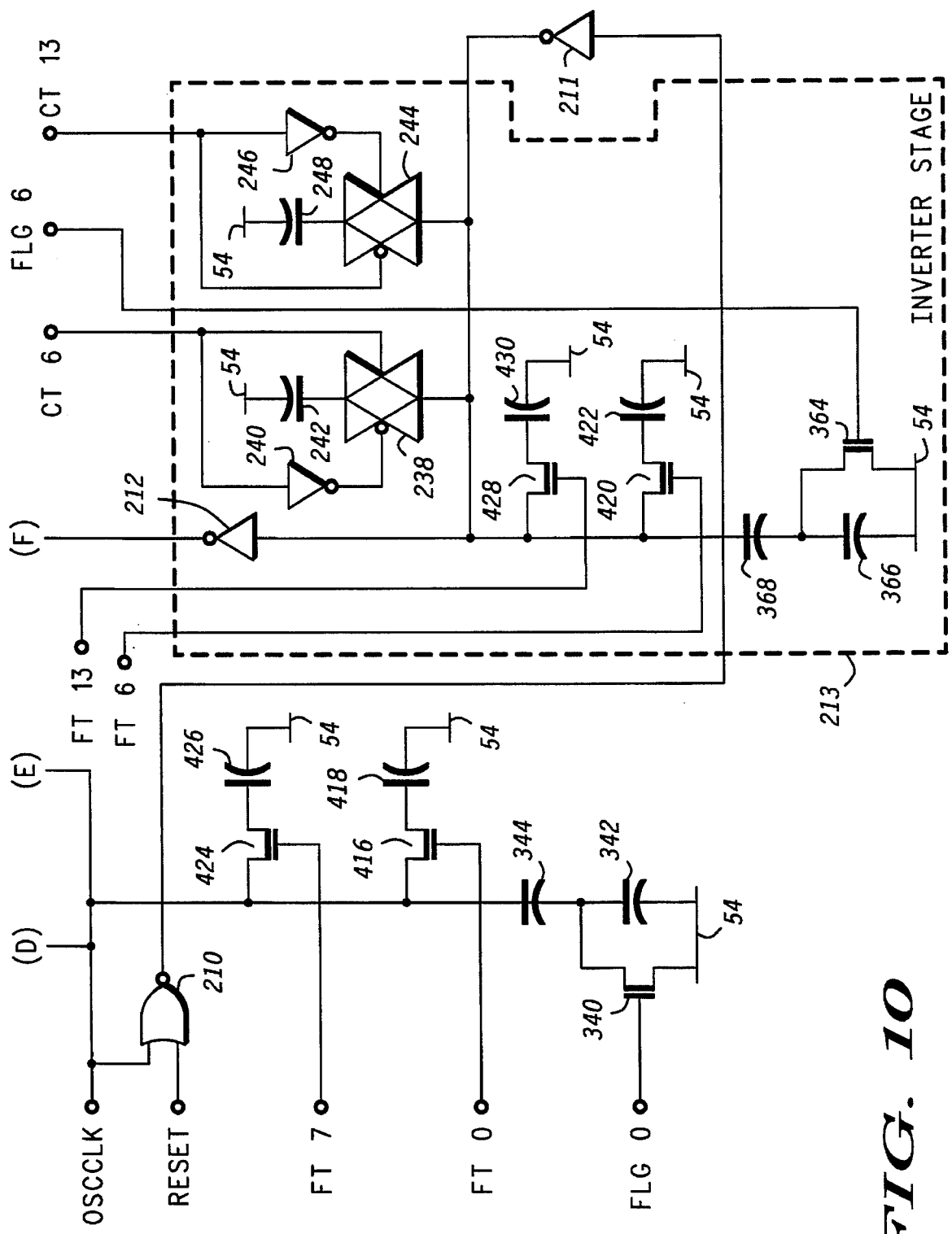

Digital controlled oscillator 14 is shown in FIGS. 9 and 10 with RESET applied to one input of NOR gate 210. The output signal from NOR gate 210 passes through inverters 211, 212, 214, 216, 218, 220, and 222. The output of inverter 222 provides the OSCCLK clock to a second input of NOR gate 210. At time $t_1$ in FIG. 3, RESET goes to logic one and forces the output of NOR gate 210 to logic zero. The signal from NOR gate 210 propagates through inverters 211–222 and forces the output of inverter 222 to logic zero. When RESET returns to logic zero, the output of NOR gate 210 goes to logic one given the logic zero from inverter 222. The logic one from NOR gate 210 propagates through inverters 211–222 and forces the output of inverter 222 back to logic one. The OSCCLK clock signal thus oscillates triggered by the rising edge of RESET with a frequency determined by the propagation delay through inverters 211–222 and NOR gate 210 which in turn is controlled by the capacitors adding and removing delay to the inverter transitions.

To initially remove a capacitor from the output of inverter 222, control signal CT0 is applied to the non-inverting control input of transmission gate 224 and through inverter 226 to its inverting control input. A logic zero CT0 disables transmission gate 224 and removes capacitor 228 from the output of inverter 222 to speed up transitions of the inverter string and increase the operating frequency of OSCCLK. If CT0 returns to logic one because the frequency of OSCCLK is too fast as described above, transmission gate 224 re-connects capacitor 228 to the output of inverter 222 to decrease the OSCCLK frequency. Capacitor 228 is selected at 0.25 pf. To initially add a capacitor, control signal CT7 is applied to the inverting control input of transmission gate 230 and through inverter 232 to its non-inverting control input. A logic zero CT7 enables transmission gate 230 and connects capacitor 234 to the output of inverter 222 to slow down transitions of the inverter string and decrease the OSCCLK frequency. Capacitor 234 is selected at 0.12 pf. If CT7 returns to logic one because the frequency of OSCCLK is too slow, transmission gate 230 disconnects capacitor 234 from the output of inverter 222 to increase the OSCCLK frequency.

To initially remove a capacitor from the input of inverter 212, control signal CT6 is applied to the non-inverting control input of transmission gate 238 and through inverter 240 to its inverting control input. A logic zero CT6 disables transmission gate 238 and removes capacitor 242 from the input of inverter 212 to speed up transitions of the inverter string and increase the OSCCLK frequency. If CT6 returns to logic one because the frequency of OSCCLK is too fast, transmission gate 238 re-connects capacitor 242 to the input of inverter 212 to decrease the OSCCLK frequency. Capacitor 242 is selected at 0.14 pf. To initially add a capacitor, control signal CT13 is applied to the inverting control input of transmission gate 244 and through inverter 246 to its non-inverting control input. A logic zero CT13 enables transmission gate 244 and connects capacitor 248 to the input of inverter 212 to slow down transitions of the inverter string and decrease the OSCCLK frequency. If CT13 returns to logic one because the frequency of OSCCLK is too slow as described above, transmission gate 244 disconnects capacitor 248 from the input of inverter 212 to increase the OSCCLK frequency. Capacitor 248 is selected at 0.04 pf.

Inverter stage 213 is shown in detail operating in response to CT6 and CT13 for course tuning. The other inverter stages follow a similar construction and operation. Control signal CT1 is applied to a transmission gate 238 in inverter stage 223, while control signal CT8 is applied to a transmission gate 244. Capacitor 242 in inverter stage 223 is selected at 0.24 pf, while capacitor 248 is selected at 0.10 pf. Control signal CT2 is applied to a transmission gate 238 in inverter stage 221, while control signal CT9 is applied to a transmission gate 244. Capacitor 242 in inverter stage 221 is selected at 0.22 pf, while capacitor 248 is selected at 0.08 pf. Control signal CT3 is applied to a transmission gate 238 in inverter stage 219, while control signal CT10 is applied to a transmission gate 244. Capacitor 242 in inverter stage 219 is selected at 0.20 pf, while capacitor 248 is selected at 0.07 pf. NOR gate 247 has inputs coupled to the outputs of inverters 216 and 220 for providing the LOAD control signal. NAND gate 249 has inputs coupled to the outputs of inverters 216 and 220 for providing the XFER control signal. Control signal CT4 is applied to a transmission gate 238 in inverter stage 217, while control signal CT11 is applied to a transmission gate 244. Capacitor 242 in inverter stage 217 is selected at 0.18 pf, while capacitor 248 is selected at 0.06 pf. Control signal CT5 is applied to a transmission gate 238 in inverter stage 215, while control signal CT12 is applied to a transmission gate 244. Capacitor 242 in inverter stage 215 is selected at 0.16 pf, while capacitor 248 is selected at 0.05 pf.

The previous discussion completes the course tune operation of digital controlled oscillator and control circuit 10. OSCCLK operates at a higher frequency than REFCLK as determined by the number of inverter stages 213–223 and the delay of each inverter stage. Once the course tuning sets the approximate frequency of operation, course tune frequency detect circuit 16 and course tune detector 18 no longer function until the next SYSTEM RESET. The fine tuning detector monitors the phase relationship between OSCCLK and REFCLK and makes fine adjustments to align the edges. The fine adjustments are made by adding or subtracting smaller valued capacitors from the inverter outputs in phase correction reset pulse circuit 12 and digital controlled oscillator 14.

Figure 11:
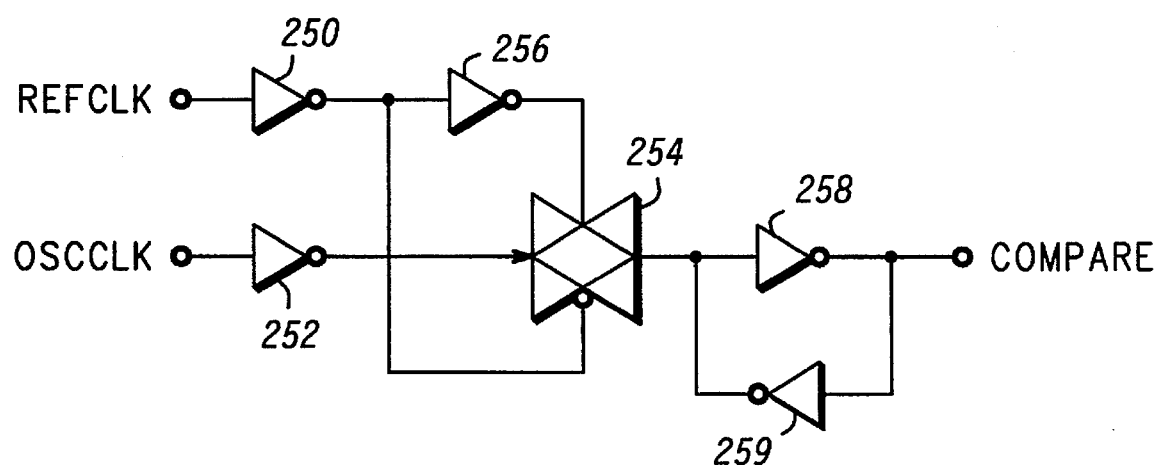
FIG. 11 is a schematic and block diagram illustrating the phase detector of FIG. 1.

In FIG. 11, phase detector 22 is shown including inverter 250 coupled for receiving REFCLK and inverter 252 coupled for receiving OSCCLK. The output of inverter 250 is coupled an inverting control input of transmission gate 254 and through inverter 256 to its non-inverting control input. Inverter 258 complements the output signal of transmission gate 254, while inverter 259 latches the output state of inverter 258. Just prior to the falling edge of REFCLK, for example before time $t_1$ in FIG. 3, REFCLK is logic one and the output of inverter 250 is logic zero and the output of inverter 256 is logic one. Transmission gate 254 passes the state of OSCCLK after inverter 252. When REFCLK goes to logic zero, transmission gate 254 turns off and blocks the OSCCLK signal. The state of OSCCLK at the falling edge of REFCLK is thus latched as the COMPARE signal. If COMPARE is logic one at the falling edge of REFCLK, then OSCCLK is leading REFCLK. If COMPARE is logic zero at the falling edge of REFCLK, then OSCCLK is lagging REFCLK.

Figure 12:
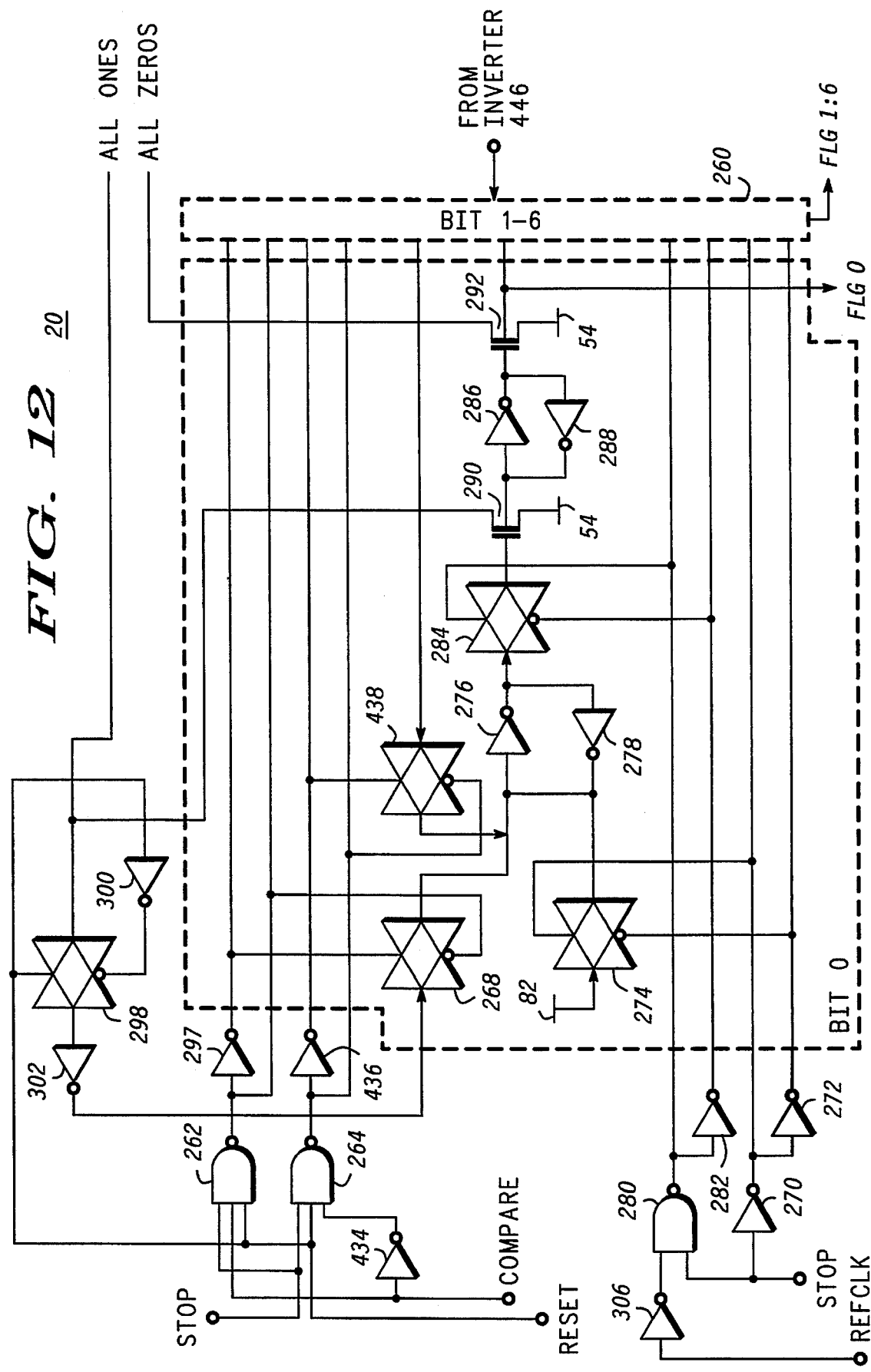
FIG. 12 is a schematic and block diagram illustrating one shift register of the fine tune detector of FIG. 1.

In FIG. 12, fine tune detector 20 is shown including a shift register 260 that can shift left and shift right. Bit 0 is shown in detail with bits 1–6 following a similar construction and operation. When STOP is logic zero during the course tuning sequence as described above, the outputs of NAND gates 262 and 264 are logic one to disable normal operation of shift register 260 by turning off transmission gates 268 and 438. The logic zero STOP signal is inverted by inverter 270 and again by inverter 272 to enable transmission gate 274. A logic one from power supply conductor 82 passes through transmission gate 274 where it is inverted by inverter 276 and latched by inverter 278. The logic zero STOP signal also produces a logic one at the output of NAND gate 280 and a logic zero at the output of inverter 282 to enable transmission gate 284. Transmission gate 284 passes the logic zero from inverter 276 to inverter 286 where inverter 288 latches its output state. Transistor 290 is non-conductive with a logic zero at the output of inverter 276 which releases the ALL$_{13}$ONES conductor. Transistor 292 turns on with a logic one at the output of inverter 286 and pulls down on the ALL_ZEROES conductor. The FLG0 is initialized to logic one from inverter 286. Bits 1–6 are also initialized to logic one with transmission gates 274 passing logic ones to inverters 276 and logic zeroes to inverters 286, i.e. FLG0:6= "1111111" In an alternate embodiment, shift register 260 could be initialized to a mixture of ones and zeros, e.g. "1110000".

Transistors 290 in bits 1–6 are off while transistors 292 are conducting. The drain of transistor 290 is coupled to the conductor labeled ALL_ONES that is coupled to the source of pull-up transistor 294 in FIG. 13. The ALL_ONES conductor is logic one while FLG0:6 are all logic one which implies that all inverters 276 are logic zero and all transistors 290 are non-conducting. ALL_ONES is logic zero when any one of the FLG0:6 control signals is logic zero which means at least one of inverters 276 is logic one and at least one of transistors 290 is conducting to pull down on transistor 294. The drain of transistor 292 is coupled to the conductor labeled ALL_ZEROES that is coupled to the source of pull-up transistor 296 in FIG. 13. ALL_ZEROES conductor is logic one while FLG0:6 are all logic zero which implies all transistors 292 are non-conducting. ALL_ZEROES is logic one when any one of the FLG0:6 control signals is logic one which means at least one of transistors 292 is conducting to pull down on transistor 296.

After course tuning is complete and OSCCLK is operating approximately the desired frequency, STOP becomes logic one and turns off transmission gate 274. Shift register 260 reacts to the value of COMPARE during the RESET pulse and shifts to the left or right depending on the value of COMPARE. COMPARE is valid only during the RESET pulse. Assume COMPARE is logic one indicating that OSCCLK is leading REFCLK. During the logic one RESET pulse, the output of NAND gate 262 goes to logic zero and the output of inverter 297 goes to logic one to enable transmission gate 268. The logic one RESET also turns on transmission gate 298 with inverter 300. The logic one ALL_ONES passes through transmission gate 298 where it is inverted by inverter 302. Transmission gate 268 passes the logic zero from inverter 302. Inverter 276 complements the signal and inverter 278 latches the resulting logic one at the output of inverter 276. When REFCLK returns to logic one at time t$_4$ in FIG. 3, the output of inverter 306 goes to logic zero and the output of NAND gate 280 goes to logic one to enable transmission gate 284 to pass the logic one from inverter 276. Transistor 290 turns on and pulls down on the ALL_ONES conductor. The output of inverter 286 goes to logic zero and inverter 288 latches it in place. FLG0 becomes logic zero and ALL_ONES is logic zero because at least one bit of shift register 260 contains a logic zero. The bit 0 output in shift register 260, i.e. FLG0, is coupled to the bit 1 input, i.e. input of transmission gate 268 in bit 1. The bit 1 output in shift register 260, i.e. FLG1, is coupled to the bit 2 input, i.e. input of transmission gate 268 in bit 2, and so on. Shift register 260 thus shifts a logic zero one position to the right in a field of logic ones in response to OSCCLK leading REFCLK.

Shift register 260 now contains "0111111" The FLG0 control signal goes to the gate of transistor 308 in FIG. 8. A logic zero FLG0 keeps transistor 308 off and capacitor 310 in series with capacitor 312 to reduce the effective capacitance at the second input of NOR gate 170. Capacitor 310 is selected at 0.02 pf, while capacitor 312 is selected at 0.02 pf. The logic one FLG1:6 control signals turn on transistors 314–324, while the logic zero FLG0 turns off transistor 326. The diode-configured transistors 328 and 330 form a voltage divider with transistor stack 314–326 to impress an analog voltage through capacitor 332 to the second input of NOR gate 170 for fine tuning. Capacitor 332 is selected at 0.02 pf. The logic one FLG6 keeps transistor 334 conducting to short out capacitor 336, leaving capacitor 338 effectively to ground to increase the capacitance at the input of inverter 174. Capacitor 336 is selected at 0.02 pf, while capacitor 338 is selected at 0.02 pf. Similarly, the logic one FLG1:5 keeps transistors 334 in inverter stages 177–185 conducting to short out capacitors 336, leaving capacitors 338 effectively to ground to increase the capacitance at the input of the respective inverter.

The same effect occurs in digital controlled oscillator 14 in FIGS. 9 and 10 where the FLG0 control signal goes to the gate of transistor 340. A logic zero FLG0 keeps transistor 340 off and capacitor 342 in series with capacitor 344 to reduce the effective capacitance at the second input of NOR gate 210. Capacitor 342 is selected at 0.02 pf, while capacitor 344 is selected at 0.02 pf. The logic one FLG1:6 control signals turn on transistors 346–356, while the logic zero FLG0 turns off transistor 358. The diode-configured transistors 360 and 361 form a voltage divider with transistor stack 346–358 to impress an analog voltage through capacitor 362 to the second input of NOR gate 210 for fine tuning. Capacitor 362 is selected at 0.02 pf. The logic one FLG6 keeps transistor 364 conducting to short out capacitor 366, leaving capacitor 368 effectively to ground to increase the capacitance at the input of inverter 212. Capacitor 366 is selected at 0.02 pf, while capacitor 368 is selected at 0.02 pf. Similarly, the logic one FLG1:5 keeps transistors 364 in inverter stages 215–223 conducting to short out capacitors 366, leaving capacitors 368 effectively to ground to increase the capacitance at the input of the respective inverter.

If OSCCLK continues to lead REFCLK and the COMPARE signal remains logic one during the next falling edge of REFCLK, then the output of NAND gate 262 again goes to logic zero during the logic one RESET pulse and enables transmission gate 268. The logic zero ALL_ONES pass through transmission gate 298 during the logic one RESET pulse. Transmission gate 268 passes a logic one from inverter 302. The output of inverter 276 goes to logic zero. When REFCLK returns to logic one, transmission gate 284 passes the logic zero from inverter 276 to turn off transistor 290. The output of inverter 286 goes to logic one to turn on transistor 292. The FLG0 control signal goes to logic one. The same logical operations are occurring in bits 1–6 to shift the logic zero that was FLG0 from bit 0 to bit 1. The FLG1 control signal goes to logic zero. Shift register 260 now contains "1011111".

Inverter 276 in bit 1 is logic one to turn on transistor 290 in bit 1 and hold ALL_ONES at logic zero. ALL_ZEROES remains logic zero because shift register 260 contains an odd logic state. The FLG0 control signal turns transistor 308 back on to short capacitor 310 in phase correction reset pulse circuit 12 in FIGS. 7 and 8. The FLG1 control signal turns off transistor 334 in inverter stage 185 to connect capacitors 336 and 338 in series. The FLG0 control signal turns transistor 340 back on to short capacitor 342 in digital controlled oscillator 14 in FIGS. 9 and 10. The FLG1 control signal turns off transistor 364 in inverter stage 223 to connect capacitors 366 and 368 in series.

As long as COMPARE is logic one indicating that OSC-CLK is leading REFCLK, the process continues to shift the logic zero through the field of logic ones in shift register 260. Inverter 302 continues to supply logic ones to transmission gate 268 while the single logic zero shifting through shift register 260 turns on transistor 290 in one of the bits to pull down on the ALL_ONES conductor. Shift register 260 shifts from "1101111" to "1110111" to "1111011" to "1111101" to "1111110". After seven consecutive occurrences of COMPARE as logic one, shift register 260 again fills with logic ones "1111111" and ALL_ONES conductor goes to logic one because there are no more transistors 290 pulling down on transistor 294.

Figure 13:
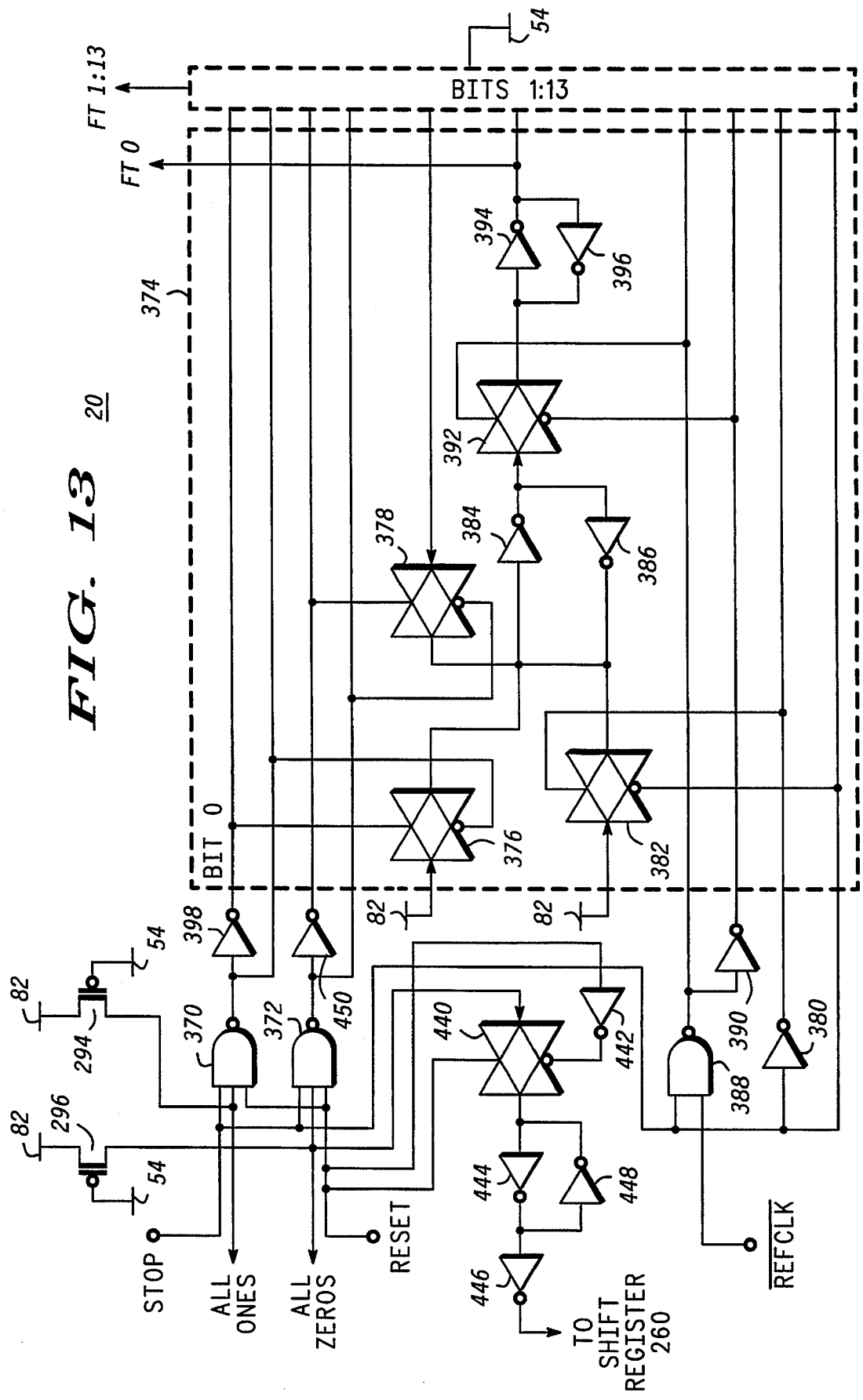
FIG. 13 is a schematic and block diagram illustrating a second shift register of the fine tune detector.

Turning to FIG. 13, when STOP is logic zero during the course tuning sequence as described above, the outputs of NAND gates 370 and 372 are logic one to disable normal operation of shift register 374 by turning off transmission gates 376 and 378. The logic zero STOP signal is inverted by inverter 380 to enable transmission gate 382. A logic one from power supply conductor 82 passes through transmission gate 382 where it is inverted by inverter 384 and latched by inverter 386. The logic zero STOP signal also produces a logic one at the output of NAND gate 388 and a logic zero at the output of inverter 390 causing transmission gate 392 to pass the logic zero from inverter 384 to inverter 394. Inverter 396 latches the output state of inverter 394. The FT0 is initialized to logic one from inverter 394. Bits 1–6 follow a similar construction and operation as bit 0 and therefore also initialize to logic ones with similar transmission gates 382 coupled to power supply conductor 82. Bits 7–13 follow a similar construction and operation as bit 0 although the transmission gates 382 in bits 7–13 receive a logic zero from power supply conductor 54 to initialize FT7:13 to logic zeroes. Shift register 374 thus begins with "11111110000000". Shift register 374 in fine tune detector 20 may begin operation when STOP goes to logic one.

After seven consecutive logic one COMPARE signals and ALL_ONES returns to logic one as described above, the output of NAND gate 370 goes to logic zero during the logic one RESET pulse and the output of inverter 398 goes to logic one to enable transmission gate 376. The logic one from power supply conductor 82 passes through transmission gate 376 where it is inverted by inverter 384. Inverter 386 latches the resulting logic zero. When REFCLK returns to logic one at time $t_4$ in FIG. 3, and $\overline{REFCLK}$ is logic zero, the output of NAND gate 388 goes to logic one to enable transmission gate 392 to pass the logic zero from inverter 384. The output of inverter 394 goes to logic one and inverter 396 latches it in place. FT0 remains logic one. The bit 0 output in shift register 374, i.e. FT0, is coupled to the bit 1 input, i.e. input of transmission gate 376 in bit 1. The bit 1 output in shift register 374, i.e. FT1, is coupled to the bit 2 input, i.e. input of transmission gate 376 in bit 2, and so on. The other bit locations perform a similar shift. Thus, the logic one from bit 6 shifts into bit 7 so that FT7 becomes logic one. Shift register now contains "11111111000000". Shift register 374 has shifted a logic one to the right one position in response to OSCCLK leading REFCLK for seven consecutive cycles.

In FIG. 8, the FT0 control signal turns on transistor 400 to connect capacitor 402 to the second input of NOR gate 170. Control signal FT6 is logic one to turn on transistor 404 and connect capacitor 406 to the input of inverter 174. Capacitor 402 is selected at 0.02 pf, while capacitor 406 is selected at 0.02 pf. Control signals FT1:5 are also logic one to turn on transistors 404 in inverter stages 177–185 to connect capacitors 406 to the input of the respective inverters. Before the most recent shift, the FT7:13 control signals were logic zero. Transistor 408 turns off and disconnects capacitor 410 from the second input of NOR gate 170. Transistor 412 turns off to disconnect capacitor 414 from the input of inverter 174. Capacitor 410 is selected at 0.02 pf, while capacitor 414 is selected at 0.02 pf. Transistors 412 in inverter stages 177–185 disconnect capacitors 414 from the input of the respective inverters. After the above described first shift, FT7 goes to logic one to turn on transistor 408 and connect capacitor 410 to the second input of NOR gate 170. The extra capacitance slows the transition of the inverter stage and widens the RESET pulse. The wider RESET pulse delays transition of OSCCLK and corrects its present phase lead with respect to REFCLK.

Whatever occurs to phase correction reset pulse circuit 12 also occurs to digital controlled oscillator 14. In FIG. 10, the FT0 control signal turns on transistor 416 and connects capacitor 418 to the second input of NOR gate 210. Control signal FT6 is logic one to turn on transistor 420 to connect capacitor 422 to the input of inverter 212. Capacitor 418 is selected at 0.02 pf, while capacitor 422 is selected at 0.02 pf. Control signals FT1:5 are also logic one to turn on transistors 420 in inverter stages 215–223 to connect capacitors 422 to the input of the respective inverters. Before the most recent shift, the FT7:13 control signals were logic zero. Transistor 424 turns off and disconnects capacitor 426 from the second input of NOR gate 210. Transistor 428 turns off to disconnect capacitor 430 from the input of inverter 212. Capacitor 426 is selected at 0.02 pf, while capacitor 430 is selected at 0.02 pf. Transistors 428 in inverter stages 215–223 disconnect capacitors 430 from the input of the respective inverters. After the first shift, FT7 goes to logic one to turn on transistor 424 and connect capacitor 426 to the second input of NOR gate 210. The extra capacitance slows the transition of the inverter stage and decreases the OSCCLK frequency. The lower OSCCLK frequency delays transition of OSCCLK and corrects its present phase lead with respect to REFCLK.

If OSCCLK continues to lead REFCLK for seven more RESET cycles where COMPARE is logic one, shift register 374 receives another logic one ALL_ONES signal and shifts to "11111111100000" Control signal FT8 goes to logic one to turn on transistor 428 in inverter stage 223 and connect its capacitor 430 to the input of inverter 222. The extra capacitance further slows the transition of the inverter stage and decreases the OSCCLK frequency. The lower OSCCLK frequency delays transition of OSCCLK and corrects its phase lead with respect to REFCLK cycles. The process continues where shift register 260 accumulates seven consecutive logic one COMPARE signals and creates a logic one ALL_ONES signal so that shift register 374 shifts a logic one to the right and adds more capacitance to the inverter stages of phase correction reset pulse circuit 12 and digital controlled oscillator 14 until OSCCLK no longer leads REFCLK. The OSCCLK clock signal becomes phase locked to the REFCLK clock signal.

Alternately, if COMPARE is logic zero indicating that OSCCLK is lagging REFCLK, then during the logic one RESET pulse the output of inverter 434 in FIG. 12 is logic one. The output of NAND gate 264 goes to logic zero and the output of inverter 436 goes to logic one to enable transmission gate 438. Assume shift register 260 is initialized with logic ones as described above. ALL_ONES is logic one and ALL_ZEROES is logic zero. In FIG. 13, the ALL_ZEROES control signal is applied to an input of transmission gate 440 that is enabled by a logic one RESET pulse and inverter 442. The output of transmission gate 440 is coupled through inverters 444 and 446 to transmission gate 438 in bit 6 of shift register 260. Inverter 448 latches the output state of inverter 444. The bit 6 output in shift register 260, i.e. FLG6, is coupled to the input of transmission gate 438 in bit 5. The bit 5 output in shift register 260, i.e. FLG5, is coupled to the input of transmission gate 438 in bit 4. The bit 4 output in shift register 374, i.e. FLG4, is coupled to the input of transmission gate 438 in bit 3, and so on.

The input of transmission gate 438 in bit 6 of shift register 260 receives the logic zero from inverter 446. The inverter 276 in bit 6 complements the signal and inverter 278 latches the resulting logic one at the output of inverter 276 in bit 6. When REFCLK returns to logic one at time $t_4$ in FIG. 3, the output of inverter 306 goes to logic zero and the output of NAND gate 280 goes to logic one to enable transmission gate 284 in bit 6 to pass the logic one from inverter 276. Transistor 290 in bit 6 turns on and pulls down on the ALL_ONES conductor. The output of inverter 286 in bit 6 goes to logic zero and inverter 288 latches it in place. Transistors 292 in bit 6 turns off and releases its hold on the ALL_ZEROES conductor. FLG6 becomes logic zero. The input of transmission gates 438 in bits 0–5 receive the logic one from the subsequent bit output. The inverters 276 in bits 0–5 complements the signal while inverters 278 latch the resulting logic zero at the output of inverter 276 in bits 0–5. When REFCLK returns to logic one at time $t_4$ in FIG. 3, transmission gates 284 in bits 0–5 pass the logic zero from inverters 276. The output of inverter 286 goes to logic zero and inverter 288 latches it in place. Transistors 292 in bits 0–5 turn on and pull down on the ALL_ZEROES conductor. ALL_ZEROES is logic zero because FLG0:5 control signals remain logic ones. Shift register 260 thus shifts a logic zero one position to the left in response to OSCCLK leading REFCLK.

Shift register 260 now contains "1111110". A logic zero FLG6 keeps transistor 334 off and capacitor 336 in series with capacitor 338 to reduce the effective capacitance at the input of inverter 174. The logic one FLG0 keeps transistor 308 conducting to short out capacitor 310, leaving capacitor 312 effectively to ground to increase the capacitance at the second input of NOR gate 170. Similarly, the logic one FLG1:5 keep transistors 334 in inverter stages 177–185 conducting to short out capacitors 336, leaving capacitors 338 effectively to ground to increase the capacitance at the input of the respective inverter.

The same effect occurs in digital controlled oscillator 14 in FIGS. 9 and 10 where a logic zero FLG6 keeps transistor 364 off and capacitor 366 in series with capacitor 368 to reduce the effective capacitance at the input of inverter 212. The logic one FLG0 keeps transistor 340 conducting to short out capacitor 342, leaving capacitor 344 effectively to ground to increase the capacitance at the second input of NOR gate 210. Similarly, the logic one FLG1:5 keeps transistors 364 in inverter stages 215–223 conducting to short out capacitors 366, leaving capacitors 368 effectively to ground to increase the capacitance at the input of the respective inverter.

If OSCCLK continues to lag REFCLK and the COMPARE signal remains logic zero during the next falling edge of REFCLK, then the output of NAND gate 264 again goes to logic zero during the logic one RESET pulse and enables transmission gate 438. The logic zero ALL_ZEROES control signal passes through transmission gate 440 with the next logic one RESET pulse and becomes latched at the output of inverter 446. Transmission gate 438 in bit 6 passes the logic zero from inverter 446. The inverter 276 in bit 6 complements the signal and inverter 278 latches the resulting logic one at the output of inverter 276 in bit 6. When REFCLK returns to logic one at time $t_4$ in FIG. 3, REFCLK at the output of inverter 306 goes to logic zero and the output of NAND gate 280 goes to logic one to enable transmission gate 284 in bit 6 to pass the logic one from inverter 276. Transistor 290 in bit 6 turns on and pulls down on the ALL_ONES conductor. The output of inverter 286 in bit 6 goes to logic zero and inverter 288 latches it in place. Transistors 292 in bit 6 turns off and releases its hold on the ALL_ZEROES conductor. FLG6 becomes logic zero. Transmission gate 438 in bit 5 also receives a logic zero from FLG6 causing FLG5 to become logic zero by the same process. The input of transmission gates 438 in bits 0–4 receive the logic one from the subsequent bit output. The inverters 276 in bits 0–4 complements the signal while inverters 278 latch the resulting logic zero at the output of inverter 276 in bits 0–4. When REFCLK returns to logic one at time $t_4$ in FIG. 3, transmission gates 284 in bits 0–4 pass the logic zero from inverters 276. The output of inverter 286 goes to logic zero and inverter 288 latches it in place. Transistors 292 in bits 0–4 turn on and pull down on the ALL_ZEROES conductor. ALL_ZEROES is logic zero because FLG0:4 control signals remain logic ones. Shift register 260 again shifts a logic zero one position to the left in response to OSCCLK leading REFCLK.

Shift register 260 now contains "1111100" A logic zero FLG5 and FLG6 keeps transistors 334 in inverter stages 175 and 177 off and capacitor 336 in series with capacitor 338 to reduce the effective capacitance at the input of inverters 174 and 176. The logic one FLG0 keeps transistor 308 conducting to short out capacitor 310, leaving capacitor 312 effectively to ground to increase the capacitance at the second input of NOR gate 170. Similarly, the logic one FLG1:4 keep transistors 334 in inverter stages 179–185 conducting to short out capacitors 336, leaving capacitors 338 effectively to ground to increase the capacitance at the input of the respective inverter.

The same effect occurs in digital controlled oscillator 14 in FIGS. 9 and 10 where logic zero FLG5 and FLG6 keep transistors 364 in inverter stages 213 and 215 off and capacitors 366 in series with capacitors 368 to reduce the effective capacitance at the inputs of inverters 212 and 214. The logic one FLG0 keeps transistor 340 conducting to short out capacitor 342, leaving capacitor 344 effectively to ground to increase the capacitance at the second input of NOR gate 210. Similarly, the logic one FLG1:4 keeps transistors 364 in inverter stages 217–223 conducting to short out capacitors 366, leaving capacitors 368 effectively to ground to increase the capacitance at the input of the respective inverter.

As long as COMPARE is logic zero indicating that OSCCLK is lagging REFCLK, the process continues to shift logic zeroes to the left through shift register 260. Shift register 260 shifts from "1111100" to "1111000" to "1110000" to "1100000" to "1000000". ALL_ZEROES remains logic zero while shift register 260 contains an odd logic state. After seven consecutive occurrences of COMPARE as logic zero, shift register 260 fills with logic zeroes "0000000" and ALL_ZEROES goes to logic one because there are no more transistors 292 pulling down on transistor 296.

Recall that shift register 374 begins with "11111110000000". After seven consecutive logic zero COMPARE signals and ALL_ZEROES goes to logic one as described above, the output of NAND gate 372 goes to logic zero during the logic one RESET pulse and the output of inverter 450 goes to logic one to enable transmission gate 378 in bit 6 of shift register 374. The bit 1 output in shift register 374, i.e. FT1, is coupled to the bit 0 input, i.e. input of transmission gate 378 in bit 0. The bit 2 output in shift register 374, i.e. FT2, is coupled to the bit 1 input, i.e. input of transmission gate 378 in bit 1, and so on. The input of transmission gate 378 in bit 13 receives a logic zero from power supply conductor 54. The input of transmission gate 378 in bit 6 receives a logic zero from FT7. The output of inverter 384 in bit 6 goes to logic one.

When REFCLK returns to logic one at time $t_4$ in FIG. 3, and REFCLK is logic zero, the output of NAND gate 388 goes to logic one to enable transmission gate 392 in bit 6 to pass the logic one from inverter 384. The output of inverter 394 in bit 6 goes to logic zero and inverter 396 latches it in place. The other bit locations perform a similar shift. During shift left operations, bit 13 back fills with logic zeroes from power supply conductor 54. Thus, the logic one from bit 7 shifts into bit 6 so that FT6 becomes logic zero. Shift register now contains "11111100000000". Shift register 374 has shifted a logic zero to the left one position in response to OSCCLK lagging REFCLK for seven consecutive cycles.

In FIG. 8, the FT0 control signal turns on transistor 400 to connect capacitor 402 to the second input of NOR gate 170. Control signal FT6 is logic zero to turn off transistor 404 and disconnect capacitor 406 to the input of inverter 174. Control signals FT1:5 are logic one to turn on transistors 404 in inverter stages 179∝185 to connect capacitors 406 to the input of the respective inverters. The less capacitance speeds up the transition of the inverter stage and shortens the RESET pulse. The shorter RESET pulse speeds up transition of OSCCLK and corrects its present phase lag with respect to REFCLK.

Whatever occurs to phase correction reset pulse circuit 12 also occurs to digital controlled oscillator 14. In FIG. 10, the FT0 control signal turns on transistor 416 to connect capacitor 418 to the second input of NOR gate 210. Control signal FT6 is logic zero to turn off transistor 420 and disconnect capacitor 422 from the input of inverter 212. Control signals FT1:5 are logic one to turn on transistors 420 in inverter stages 217–223 to connect capacitors 422 to the input of the respective inverters. The less capacitance speeds up the transition of the inverter stage and increases the OSCCLK frequency. The higher OSCCLK frequency speeds up transitions of OSCCLK and corrects its phase lag with respect to REFCLK.

If OSCCLK continues to lag REFCLK for seven more RESET cycles where COMPARE is logic zero, shift register 374 receives another logic one ALL_ZEROES signal and shifts to "11111000000000". Control signal FT5 goes to logic zero to turn off transistor 420 in inverter stage 215 and connect capacitor 422 to the input of inverter 214. The less capacitance further speeds up the transition of the inverter stage and increases the OSCCLK frequency. The higher OSCCLK frequency speeds up transition of OSCCLK and corrects its phase lag with respect to REFCLK cycles.

The process continues where shift register 260 accumulates seven consecutive logic zero COMPARE signals and creates a logic one ALL_ZEROES signal so that shift register 374 shifts a logic zero to the left and removes more capacitance to the inverter stages of phase correction reset pulse circuit 12 and digital controlled oscillator 14 until OSCCLK no longer lags REFCLK. The OSCCLK clock signal becomes phase locked to the REFCLK clock signal.

Shift register 260 provides a digital filtering effect in that OSCCLK must lead or lag REFCLK for seven consecutive RESET cycles before any adjustments are made. Once digital controlled oscillator 14 is properly operating with OSCCLK phase locked to REFCLK, shift register 260 will continue shifting logic zeroes and logic ones back and forth to make minor adjustments to the edge alignment between REFCLK and OSCCLK.

During normal operation, fine tune detector 20 may receive alternating or intermixed logic zero and logic one COMPARE signals. Shift register 260 shifts left and right in response to each logic state of COMPARE. Thus, after say three occurrences of logic one COMPARE signals followed by one occurrence of a logic zero COMPARE signal, the output state of shift register 260 is FLG0:6="1011110". There is no effect to capacitors like 418 and 422 because COMPARE did not repeat the same logic state seven consecutive times. However, the FLG0:6 signals turn on and turn off transistors 314–326 in FIG. 7 and transistors 346–358 in FIG. 9. In the above example, transistors 316, 318, 320, 322, and 326 are conducting and transistors 314 and 324 are non-conducting. Likewise, transistors 348, 350, 352, 354, and 358 are conducting and transistors 346 and 356 are non-conducting. The number of conducting transistors determines the current flow through diode-configured transistors 328–330 and 360–361. An analog voltage develops across capacitors 332 and 362 as a function of control signals FLG0:6 to make fine adjusts to the delay at the second inputs of NOR gates 170 and 210. The magnitude of the analog voltage determines the effective capacitance of capacitors 332 and 362 seen at the second inputs of NOR gates 170 and 210 to alter the pulse width of RESET and the frequency of OSCCLK.

In an alternate embodiment, multiple clock frequencies may be selected from settings stored in a register. The digital controlled oscillator could support frequency switching by allowing the course tune detector time to train on each desired frequency and storing or latching the on/off conditions for capacitor settings. A switch to another oscillator clock frequency involves switching the new capacitor values on the digital controlled oscillator and phase correction reset pulse circuit based on the stored settings and then allowing time for the fine tune detector to train.

By now it should be appreciated that the present invention provides a digital controlled oscillator that generates an oscillator clock that is phase locked to a reference clock without using a phase lock loop. A control circuit generates a reset signal from the reference clock that sets the edges of the oscillator signal in line with an edge of the reference clock. The reset signal must have correct timing and duration. A course tune detector monitors the oscillator clock and generates course tune control signals that adjust the reset signal pulse width and the oscillator signal frequency by adding and removing capacitors from the inverters in the control circuit and digital controlled oscillator. A phase comparator compares the reference clock and the oscillator clock. A fine tune detector monitors the phase comparison and generates course tune control signals that make fine adjustments to the pulse width of the reset signal and the frequency of the oscillator signal. Once the OSCCLK clock becomes phase locked to the REFCLK clock without the use of a conventional phase lock loop, it is not susceptible to the same power supply and temperature variation problems noted in the background.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A digital controlled oscillator, comprising:

an oscillating circuit operating in response to a reset signal for generating an oscillator clock signal; and a control circuit operating in response to a reference clock signal for generating said reset signal that aligns said oscillator clock signal to said reference clock signal.

2. The digital controlled oscillator of claim 1 wherein said oscillating circuit includes:

a plurality of serially coupled first inverters where an input of a first one is coupled to an output of a last one for providing said oscillator clock signal; and a plurality of first capacitors coupled to outputs of said first inverters.

3. The digital controlled oscillator of claim 2 wherein said oscillating circuit further generates a load control signal at a first edge of said oscillator clock signal and a transfer control signal at a second edge of said oscillator clock signal.

4. The digital controlled oscillator of claim 3 wherein said control circuit includes:

a course tune frequency detect circuit operating in response to said load control signal and said transfer control signal for generating an overflow control signal that changes state upon receiving a predetermined number of said load control signals and transfer control signals within a predetermined period;

a course tune detector operating in response to said state of said overflow control signal for generating a course tune control signal that connects and disconnects said plurality of first capacitors from said outputs of said first inverters to perform frequency adjustments on said oscillator clock signal; and a phase correction circuit operating in response to said course tune control signal to perform pulse width adjustments on said reset control signal.

5. The digital controlled oscillator of claim 4 wherein said phase correction circuit includes:

a plurality of serially coupled second inverters having an input coupled for receiving said reference clock signal and having an output for providing said reset signal; and a plurality of second capacitors that are coupled to and disconnected from said outputs of said second inverters in response to said course tune control signal to perform pulse width adjustments on said reset control signal.

6. The digital controlled oscillator of claim 5 wherein said control circuit further includes:

a phase detector responsive to said reference clock signal and said oscillator clock signal for generating a compare control signal having a first logic state when said oscillator clock signal leads said reference clock signal and a second logic state when said oscillator clock signal lags said reference clock signal; and a fine tune detector operating in response to said first and second logic states of said compare control signal for generating a fine tune control signal that connects and disconnects a plurality of third capacitors from said outputs of said first inverters to perform frequency adjustments on said oscillator clock signal, said fine tune control signal further controlling said phase correction circuit to connect and disconnect a plurality of fourth capacitors from said outputs of said second inverters to perform pulse width adjustments on said reset control signal.

7. A method of digitally controlling an oscillator, comprising the steps of:

generating an oscillator clock signal in response to a reset signal; and generating said reset signal in response to a reference clock signal that aligns said oscillator clock signal to said reference clock signal.

8. The method of claim 7 further including the step of generating a load control signal at a first edge of said oscillator clock signal and a transfer control signal at a second edge of said oscillator clock signal.

9. The method of claim 8 further including the step of generating an overflow control signal in response to said load control signal and said transfer control signal that changes state upon receiving a predetermined number of said load control signals and transfer control signals within a predetermined period.

10. The method of claim 9 further including the step of generating a course tune control signal in response to said state of said overflow control signal that connects and disconnects said plurality of first capacitors from said outputs of said first inverters to perform frequency adjustments on said oscillator clock signal.

11. The method of claim 10 further including the step of performing pulse width adjustments on said reset control signal in response to said course tune control signal.

12. The method of claim 11 further including the step of generating a compare control signal in response to said reference clock signal and said oscillator clock signal, said compare signal having a first logic state when said oscillator clock signal leads said reference clock signal and a second logic state when said oscillator clock signal lags said reference clock signal.

13. The method of claim 12 further including the step of generating a fine tune control signal in response to said first and second logic states of said compare control signal, said fine tune control signal connecting and disconnecting a plurality of third capacitors from said outputs of said first inverters to perform frequency adjustments on said oscillator clock signal, said fine tune control signal further controlling said phase correction circuit to connect and disconnect a plurality of fourth capacitors from said outputs of said second inverters to perform pulse width adjustments on said reset control signal.

14. A digital controlled oscillator, comprising:

an oscillating circuit operating in response to a reset signal for generating an oscillator clock signal, said oscillating circuit including,
  (a) a plurality of serially coupled first inverters where an input of a first one is coupled to an output of a last one for providing said oscillator clock signal, and
  (b) a first capacitor coupled to an output of one of said first inverters; and a control circuit operating in response to a reference clock signal for generating said reset signal that aligns said oscillator clock signal to said reference clock signal.

15. The digital controlled oscillator of claim 14 wherein said oscillating circuit further generates a load control signal at a first edge of said oscillator clock signal and a transfer control signal at a second edge of said oscillator clock signal.

16. The digital controlled oscillator of claim 15 wherein said control circuit includes:

a course tune frequency detect circuit operating in response to said load control signal and said transfer control signal for generating an overflow control signal that changes state upon receiving a predetermined number of said load control signals and transfer control signals within a predetermined period;

a course tune detector operating in response to said state of said overflow control signal for generating a course tune control signal that connects and disconnects said plurality of first capacitors from said outputs of said first inverters to perform frequency adjustments on said oscillator clock signal; and a phase correction circuit operating in response to said course tune control signal to perform pulse width adjustments on said reset control signal.

17. The digital controlled oscillator of claim 16 wherein said phase correction circuit includes a plurality of serially coupled second inverters having an input coupled for receiving said reference clock signal and having an output for providing said reset signal.

18. The digital controlled oscillator of claim 17 wherein said phase correction circuit further includes a second capacitor that is coupled to and disconnected from an output of one of said second inverters to perform pulse width adjustments on said reset control signal.

19. The digital controlled oscillator of claim 18 wherein said control circuit further includes:

a phase detector responsive to said reference clock signal and said oscillator clock signal for generating a compare control signal having a first logic state when said oscillator clock signal leads said reference clock signal and a second logic state when said oscillator clock signal lags said reference clock signal; and a fine tune detector operating in response to said first and second logic states of said compare control signal for generating a fine tune control signal that connects and disconnects a third capacitor from an output of a second one of said first inverters to perform frequency adjustments on said oscillator clock signal, said fine tune control signal further controlling said phase correction circuit to connect and disconnect a fourth capacitor from an output of a second one of said second inverters to perform pulse width adjustments on said reset control signal.

\* \* \* \* \*

UNITED STATES PATENT AND TRADEMARK OFFICE
CERTIFICATE OF CORRECTION

PATENT NO. : 5,495,205
DATED : February 27, 1996
INVENTOR(S) : Lanny L. Parker, Ahmad H. Atriss, Benjamin C. Peterson It is certified that error appears in the above-indentified patent and that said Letters Patent is hereby corrected as shown below:

On the title page, item [73];
The Assignee should be changed from Robert D. Atkins to Motorola, Inc.

Signed and Sealed this

Nineteenth Day of November, 1996

Attest:

BRUCE LEHMAN

*Attesting Officer*  *Commissioner of Patents and Trademarks*